United States Patent
McKinley et al.

(10) Patent No.: US 10,170,678 B2
(45) Date of Patent: Jan. 1, 2019

(54) THERMOMECHANICAL CYCLE FOR THERMAL AND/OR MECHANICAL ENERGY CONVERSION USING PIEZOELECTRIC MATERIALS

(71) Applicant: THE REGENTS OF THE UNIVERSITY OF CALIFORNIA, Oakland, CA (US)

(72) Inventors: Ian McKinley, Venice, CA (US); Laurent G. Pilon, Sherman Oaks, CA (US)

(73) Assignee: The Regents of the University of California, Oakland, CA (US)

( * ) Notice: Subject to any disclaimer, the term of this patent is extended or adjusted under 35 U.S.C. 154(b) by 944 days.

(21) Appl. No.: 14/219,958

(22) Filed: Mar. 19, 2014

(65) Prior Publication Data

US 2014/0285061 A1 Sep. 25, 2014

Related U.S. Application Data

(60) Provisional application No. 61/804,108, filed on Mar. 21, 2013.

(51) Int. Cl.
*H01L 37/02* (2006.01)

(52) U.S. Cl.
CPC .................. *H01L 37/02* (2013.01)

(58) Field of Classification Search
CPC ........... H02N 10/00; H02N 3/00; H01L 37/02
USPC ........................................ 310/306, 339, 346
See application file for complete search history.

(56) References Cited

U.S. PATENT DOCUMENTS

| | | | | |
|---|---|---|---|---|
| 2011/0163636 A1* | 7/2011 | Sirbuly | .................. | B82Y 30/00 310/339 |
| 2012/0019098 A1* | 1/2012 | Erbil | ....................... | H01L 37/02 310/306 |
| 2012/0256427 A1* | 10/2012 | Mitchell | ................ | H02N 10/00 290/1 R |
| 2013/0300258 A1* | 11/2013 | Ting | ....................... | H02N 2/186 310/339 |

OTHER PUBLICATIONS

Chen et al., "A Review of Thermodynamic Cycles and Working Fluids for the Conversion of Low-Grade Heat", Renewable and Sustainable Energy Reviews, vol. 14, pp. 3059-3067, 2010.

(Continued)

*Primary Examiner* — Bryan Gordon
(74) *Attorney, Agent, or Firm* — Foley & Lardner LLP; Cliff Z. Liu

(57) ABSTRACT

A system for generating electrical energy includes a thermal source, an electric field source, a stress source, a piezoelectric component, and a cycle controller coupled to the thermal source, the electric field source, and the stress source. The cycle controller provides control signals to the thermal source, the electric field source, and the stress source to repeatedly cycle the piezoelectric component through the sequence: (a) application of: a first temperature, a first electric field, and a first stress; (b) application of: the first temperature, a second electric field greater than the first electric field, and the first stress; (c) application of: a second temperature, the second electric field, and a second stress greater than the first stress; and (d) application of: the second temperature, the first electric field, and the second stress.

27 Claims, 23 Drawing Sheets

(56) References Cited

OTHER PUBLICATIONS

Chin et al., "Direct Thermal to Electrical Energy Conversion Using 9.5/65/35 PLZT Ceramics in the Ergodic Relaxor Phase", IEEE Transactions on Ultrasonics, Ferroelectrics, and Frequency Control, vol. 59, pp. 2373-2385, 2012.
Epstein et al., "Electrocaloric Devices Bases on Thin-Film Heat Switches", Journal of Applied Physics, vol. 106, pp. 064509 1-7, 2009.
Fang et al., "Harvesting Nanoscale Thermal Radiation Using Pyroelectric Materials", ASM E Journal of Heat Transfer, vol. 132, No. 9, pp. 092701 1-10, 2010.
Feng et al., "Effect of Uniaxial Stress on the Electromechanical Response of <001>-Oriented $Pb(Mg_{1/3}Nb_{2/3})O_3$—$PbTiO_3$ Crystals", Journal of Applied Physics, vol. 97, pp. 024103 1-5, 2005.
Guo et al., "The Phase Transition Sequence and the Location of the Morphotropic Phase Boundary Region in $(1-x)[Pb(Mg_{1/3}Nb_{2/3})O_3$-$xPbTiO_3$ Single Crystal", Journal of Physics: Condensed Matter, vol. 15, pp. L77-L82, 2003.
Han et al., "Electric Field Effects on the Phase Transitions in $[001]$-Oriented $(1-x)Pb(Mg_{1/3}Nb_{2/3})O_3$-$xPbTiO_3$ Single Crystals with Compositions Near the Morphotropic Phase Boundary", Physical Review B, vol. 68, pp. 134102 1-6, 2003.
Herklotz et al., "Electrical Characterization of PMN-28%PT(001) Crystals Used as Thin-Film Substrates", Journal of Applied Physics, vol. 108, pp. 094101 1-7, 2010.
Hooker, M.W., "Properties of PZT-Based Piezoelectric Ceramics Between −150 and 250° C.", Tech. Rep. NASA contractor report 1998-208708, National Aeronautics and Space Administration, Hampton, VA, 1998.
Hunter et al., "Development of MEMS Based Pyroelectric Thermal Energy Harvesters", in Proceedings of the SPIE, Apr. 25, 2011, vol. 8035, pp. 80350V 1-12.
Kamzina et al., "Influence of the Electric Field on Structural Transformations and Phase Boundary for $PMg_{1/3}Nb_{2/3}O_3$-$xPBTiO_3$ Single Crystals", Physics of the Solid State, vol. 51, No. 11, pp. 2316-2323, 2009.
Kandilian et al., "The Pyroelectric Energy Harvesting Capabilities of PMN-PT Near the Morphotropic Phase Boundary", Smart Materials and Structures, vol. 20, No. 5, pp. 055020 1-10, 2011.
Lee et al., "Pyroelectric Waste Heat Energy Harvesting Using Heat Conduction", Applied Thermal Engineering, vol. 37, pp. 30-37, 2012.
Lee et al., "Pyroelectric waste heat energy harvesting using relaxor ferroelectric 8/65/35 PLZT and the Olsen cycle", Smart Materials and Structures, vol. 21, pp. 025021 1-12, 2012.
Li et al., "Dielectric/Ferroelectric Response and Phase Transition of PMN-0.32PT Single Crystal", Journal of Materials Science Letters, vol. 21, pp. 1325-1327, 2002.
Lynch, C.S., "The Effect of Uniaxial Stress on the Electro-Mechanical Response of 8/65/35 PLZT", Acta Materialia, vol. 44, pp. 4137-4148, 1996.
McKinley et al., "Waste Heat Energy Harvesting Using the Olsen Cycle on $0.945Pb(Zn_{1/3}Nb_{2/3})O_3$-$0.055PbTiO_3$ Single Crystals", Smart Materials and Structures, vol. 21, No. 3, pp. 035015 1-10, 2012.
McLaughlin et al., "Relaxor ferroelectric PMN-32%PT Crystals Under Stress and Electric Field Loading: I-32 Mode Measurements", Acta Materialia, vol. 52, pp. 3849-3857, 2004.
McLaughlin et al., "Relaxor Ferroelectric PMN-32%PT Crystals Under Stress, Electric Field and Temperature Loading: II-33-mode Measurements", Acta Materialia, vol. 53, No. 14, pp. 4001-4008, 2005.
Merz W J, "Double Hysteresis Loop of $BaTiO_3$ at the Curie Point", Physical Review, vol. 91, pp. 513-517, 1953.
Navid et al., "Purified and Porous Poly(Vinylidene Fluoride-Trifluoroethylene) Thin Films for Pyroelectric Infrared Sensing and Energy Harvesting", Smart Materials and Structures, vol. 19, pp. 055006 1-13, 2010.
Navid et al., "Pyroelectric Energy Harvesting Using Olsen Cycles in Purified and Porous Poly(vinylidene fluoride-trifuoroethylene) [P(VDF-TrFE)] Thin Films", Smart Materials and Structures, vol. 20, pp. 025012 1-9, 2011.
Navid et al., "Towards Optimization of a Pyroelectric Energy Converter for Harvesting Waste Heat", International Journal of Heat and Mass Transfer, vol. 53, No. 19-20, pp. 4060-4070, 2010.
Nguyen et al., "Pyroelectric energy Converter Using Co-Polymer P(VDF-TrFE) and Olsen Cycle for Waste Heat Energy Harvesting", Applied Thermal Engineering, vol. 30, No. 14-15, pp. 2127-2137, 2010.
Olsen et al., "A Pyroelectric Energy Converter Which Employs Regeneration", Ferroelectrics, vol. 38, pp. 975-978, 1981.
Olsen et al., "Cascaded Pyroelectric Energy Converter", Ferroelectrics, vol. 59, pp. 205-219, 1984.
Olsen et al., "High-Efficiency Direct Conversion of Heat to Electrical Energy-Related Pyroelectric Measurements", Ferroelectrics, vol. 40, pp. 17-27, 1982.
Olsen et al., "Pyroelectric Conversion Cycle of Vinylidene Fluoride-Trifluoroethylene Copolymer", Journal of Applied Physics, vol. 57, pp. 5036-5042, 1985.
Olsen et al., "Pyroelectric Energy Conversion: Hysteresis Loss and Temperature Sensitivity of a Ferroelectric Material", Journal of Applied Physics, vol. 54, pp. 5941-5944, 1983.
Olsen, R.B., "Ferroelectric Conversion of Heat to Electrical Energy—A Demonstration", Journal of Energy, vol. 6, pp. 91-95, 1982.
Park et al., "Ultrahigh Strain and Piezoelectric Behavior in Relaxor Based Ferroelectric Single Crystals", Journal of Applied Physics, vol. 82, No. 4, pp. 1804-1811, 1997.
Ravindran et al., "A Self-Sustaining Micro Thermomechanic-Pyroelectric Generator", Applied Physics Letters, vol. 99, No. 10, pp. 104102 1-3, 2011.
Thombare et al., "Technological Development in the Stirling Cycle Engines", Renewable and Sustainable Energy Reviews, vol. 12, pp. 1-38, 2008.
Viehland et al., "Effect of Uniaxial Stress on the Large-Signal Electromechanical Properties of Electrostrictive and Piezoelectric Lead Magnesium Niobate Lead Titanate Ceramics", Applied Physics Letters, vol. 95, pp. 1969-1972, 2004.
Viehland et al., "Electromechanical Coupling Coefficient of <001>-Oriented $Pb(Mg_{1/3}Nb_{2/3})O_3$—$PbTiO_3$ Crystals: Stress and Temperature Independence", Applied Physics Letters, vol. 78, pp. 3112-3114, 2001.
Ye et al., "Morphotropic Domain Structures and Phase Transitions in Relaxor-based Piezo-/Ferroelectric $(1-x)Pb(Mg_{1/3}Nb_{2/3})O_3$-$xPbTiO_3$ Single Crystals", Journal of Applied Physics, vol. 87, No. 5, pp. 2312-2319, 2000.
Zebarjadi et al., "Perspectives on Thermoelectrics: From Fundamentals to Device Applications", Energy and Environmental Science, vol. 5, pp. 5147-5162, 2012.
Zhou et al., "Characterization of Complete Electromechanical Constants of Rhombohedral $0.72Pb(Mg_{1/3}Nb_{2/3})$-$0.28PbTiO_3$ Single Crystals", Journal of Physics D: Applied Physics, vol. 41, pp. 185402 1-4, 2008.

* cited by examiner

THERMOMECHANICAL CYCLE FOR THERMAL AND/OR MECHANICAL ENERGY CONVERSION USING PIEZOELECTRIC MATERIALS

CROSS-REFERENCE TO RELATED PATENT APPLICATIONS

This application claims the benefit of U.S. Provisional Patent Application 61/804,108 filed on Mar. 21, 2013 to McKinley et al., titled "Thermomechanical Cycle for Thermal and/or Mechanical Energy Conversion Using Ferroelectric Materials," the contents of which are incorporated herein by reference in their entirety.

STATEMENT REGARDING FEDERALLY SPONSORED RESEARCH OR DEVELOPMENT

This invention was made with government support under Grant Number DGE0903720, awarded by the National Science Foundation. The government has certain rights in the invention.

BACKGROUND

Energy conversion is important for many processes. Additionally, harvesting thermal and mechanical energies could contribute to more sustainable and efficient energy use. Improved energy conversion capability is thus desirable.

SUMMARY

A system for generating electrical energy includes a thermal source, an electric field source, a stress source, a piezoelectric component, and a cycle controller coupled to the thermal source, the electric field source, and the stress source. The cycle controller provides control signals to the thermal source, the electric field source, and the stress source to repeatedly cycle the piezoelectric component through the sequence: (a) application of: a first temperature, a first electric field, and a first stress; (b) application of: the first temperature, a second electric field greater than the first electric field, and the first stress; (c) application of: a second temperature, the second electric field, and a second stress greater than the first stress; and (d) application of: the second temperature, the first electric field, and the second stress. The second temperature may be greater than or equal to the first temperature.

BRIEF DESCRIPTION OF THE DRAWINGS

FIG. 3A illustrates an example of an Olsen cycle.
FIG. 3B illustrates an example of a new power cycle.

DETAILED DESCRIPTION

Figure 1:
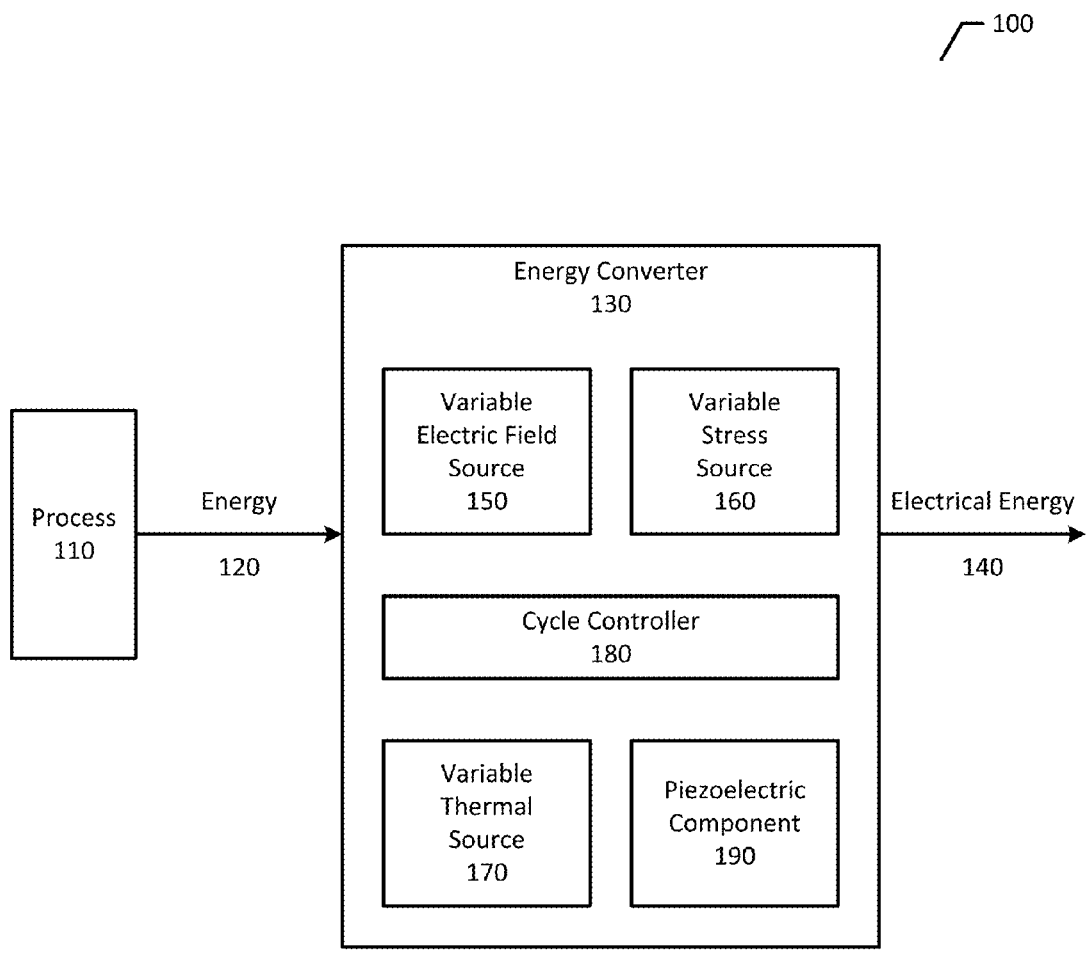
FIG. 1 illustrates an example of an energy conversion system.

Acronyms and Definitions
$T_C$: applied cold temperature
$T_H$: applied high temperature
$T_{cold}$: material cold temperature
$T_{hot}$: material high temperature
V: Volts (MV: megavolt)
μC: microCoulomb
J: Joules
W: Watts
g: gram (kg: kilogram; mg: milligram)
m: meter (cm: centimeter; mm: millimeter)
L: liter
Pa: Pascals (kPa: kiloPascals)
DC: direct current
C: Celsius
K: Kelvin This disclosure presents a new power cycle for direct conversion of thermomechanical energy into electrical energy using piezoelectric materials. The cycle includes, sequentially: (i) isothermal electric poling performed under substantially zero stress; (ii) uniaxial compressive stress during a heating transition; (iii) an isothermal electric de-poling under uniaxial stress; and (iv) the removal of compressive stress during a cooling transition. The new power cycle is able to generate electrical energy at temperatures below those of the Olsen cycle. In addition, the new power cycle is able to adapt to changing thermal and mechanical conditions. A variation of the new power cycle maintains an applied isothermal temperature throughout the cycle such that a temperature of the piezoelectric material is held close to constant at a bias temperature $T_{bias}$. $T_{bias}$ is selected such that application of stress to the piezoelectric material in stage (ii) causes the material to undergo a phase transformation. $T_{bias}$ is further selected such that a phase transition caused by stress changes in stage (iv) of the cycle is a phase transition to a phase with a maximize polarization.

In a piezoelectric material, the electric charge within the material changes when the material is mechanically deformed. Applying a compressive stress in the poling direction decreases the electric displacement for a given temperature and electric field. The reduction in surface charge can be captured as current in an external load.

A subclass of piezoelectric materials is pyroelectric materials. Pyroelectric materials possess a temperature-dependent spontaneous polarization defined as the average electric dipole moment per unit volume in the absence of an applied electric field. For a subclass of pyroelectric materials, known as ferroelectrics, there exists the ability to switch the direction and magnitude of the spontaneous polarization by applying a magnetic field opposite and with greater magnitude than a coercive electric field due to the spontaneous polarization.

The new power cycle leverages the piezoelectric properties of a material, and may further leverage the pyroelectric properties of the material. Categories of pyroelectric materials include (i) ceramics such as lead zirconate titanate (PZT), barium titanate (BaTiO3), and lithium titanate (Li-TiO3), (ii) single crystals such as lead magnesium niobate-lead titanate (PMN-PT) and lead zirconate niobate-lead titanate (PZN-PT), (iii) polymers like polyvinylidene fluoride (PVDF), polyvinylidene fluoride trifluoroethylene (P(VDF-TrFE)), and polyvinylidene fluoride trifluoroethylene chlorofluoroethylene (P(VDF-TrFE-CFE)), (iv) biological materials including bovine phalanx, femur bones, and collagen (found in fish scales and hair), and (v) minerals such as tourmaline and quartz.

The new power cycle provides substantially improved cycle time over the Olsen cycle.

The new power cycle was demonstrated experimentally on [001]-poled PMN-28PT (0.72PbMg$_{1/3}$Nb$_{2/3}$O$_3$-0.28Pb-TiO$_3$) pyroelectric single crystals, and performance and constraints on the operating conditions of the new cycle were compared with those of the Olsen cycle.

FIG. 1 illustrates system 100 for energy conversion in accordance with this disclosure. System 100 includes a process 110 that generates energy 120 by its operation. Energy 120 may be waste energy of process 110. Energy converter 130 receives energy 120 and converts it to electrical energy 140. Energy converter 130 includes a variable electric field source 150, a variable stress source 160, and a variable thermal source 170. The conversion cycle is controlled by cycle controller 180, which controls changes in electric field, stress, and temperature to perform cycles of energy conversion, and to adapt the cycles to the energy received and to the present environmental conditions. Cycle controller 180 may be, may include, or may be included in, a computing device. Cycle controller 180 controls variable electric field source 150, variable stress source 160, and variable thermal source 170 to selectively apply an electric field, stress, and temperature, respectively, to a piezoelectric component 190, which in response generates electrical energy. Power for operation of variable electric field source 150, variable stress source 160, and variable thermal source 170 may be provided by energy 120 received from process 110, and cycle controller 180 may control the new power cycle based on the energy 120 presently available.

Figure 2:
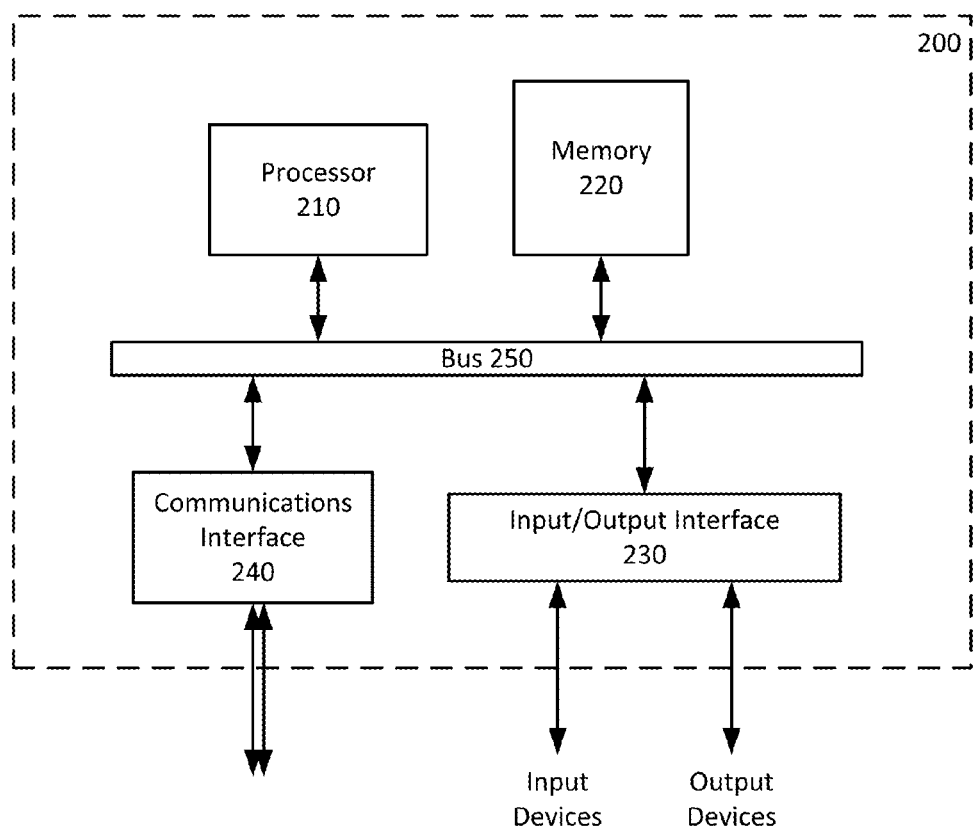
FIG. 2 illustrates an example of a computing device.

FIG. 2 illustrates an example of a computing device 200 that includes a processor 210, a memory 220, an input/output interface 230, and a communication interface 240. A bus 250 provides a communication path between two or more of the components of computing device 200. The components shown are provided by way of illustration and are not limiting. Computing device 200 may have additional or fewer components, or multiple of the same component.

Processor 210 represents one or more of a processor, microprocessor, microcontroller, ASIC, and/or FPGA, along with associated logic.

Memory 220 represents one or both of volatile and non-volatile memory for storing information. Examples of memory include semiconductor memory devices such as EPROM, EEPROM and flash memory devices, magnetic disks such as internal hard disks or removable disks, magneto-optical disks, CD-ROM and DVD-ROM disks, and the like.

Input/output interface 230 represents electrical components and optional code that together provides an interface from the internal components of computing device 200 to external components. For example, a signal representing a value of energy 120, such as a temperature, voltage, or current may be received at input/output interface 230, and computing device 200 may use information in the signal to adjust the new power cycle according to the available energy 120. For another example, input/output interface 230 may provide control signals to devices such as variable electric field source 150, variable stress source 160, and variable thermal source 170.

Communications interface 240 represents electrical components and optional code that together provides an interface from the internal components of computing device 200 to external networks.

Bus 250 represents one or more interfaces between components within computing device 200. For example, bus 250 may include a dedicated connection between processor 210 and memory 220 as well as a shared connection between processor 210 and multiple other components of computing device 200.

Portions of cycle controller 180 may be implemented as computer-executable instructions in memory 220 of computing device 200, executed by processor 210. An embodiment of the disclosure relates to a non-transitory computer-readable storage medium having computer code thereon for performing various computer-implemented operations. The term "computer-readable storage medium" is used herein to include any medium that is capable of storing or encoding a sequence of instructions or computer codes for performing the operations, methodologies, and techniques described herein. The media and computer code may be those specially designed and constructed for the purposes of the embodiments of the disclosure, or they may be of the kind well known and available to those having skill in the computer software arts. Examples of computer-readable storage media include, but are not limited to: magnetic media such as hard disks, floppy disks, and magnetic tape; optical media such as CD-ROMs and holographic devices; magneto-optical media such as optical disks; and hardware devices that are specially configured to store and execute program code, such as application-specific integrated circuits ("ASICs"), programmable logic devices ("PLDs"), and ROM and RAM devices.

Examples of computer code include machine code, such as produced by a compiler, and files containing higher-level code that are executed by a computer using an interpreter or a compiler. For example, an embodiment of the disclosure may be implemented using Java, C++, or other object-oriented programming language and development tools. Additional examples of computer code include encrypted code and compressed code. Moreover, an embodiment of the disclosure may be downloaded as a computer program product, which may be transferred from a remote computer (e.g., a server computer) to a requesting computer (e.g., a client computer or a different server computer) via a transmission channel. Another embodiment of the disclosure may be implemented in hardwired circuitry in place of, or in combination with, machine-executable software instructions.

Cycle controller 180 controls the new power cycle to convert thermal energy and/or mechanical energy into electrical energy using a piezoelectric material. The piezoelectric material may be also pyroelectric.

The electric displacement D of a pyroelectric material at temperature T under electric field E and compressive stress σ can be expressed as in equation (1).

$$D(E,T,\sigma)=\varepsilon_0\varepsilon_r(T,\sigma)E+P_S(T,\sigma) \quad (1)$$

In equation (1), $\varepsilon_0$ is the vacuum permittivity (=8.854×10$^{-12}$ F/m) and $\varepsilon_r(T,\sigma)$ is the large-field relative permittivity of the material at temperature T and under stress σ. The saturation polarization $P_S(T,\sigma)$ is equal to the electric displacement in the linear fit of D versus E at large field extrapolated to zero electric field, and the slope of this linear fit corresponds to the product $\varepsilon_0\varepsilon_r(T,\sigma)$. Other important properties include (i) the remnant polarization $P_r(T,\sigma)$ corresponding to the polarization under zero applied electric field, (ii) the coercive field $E_c(T,\sigma)$ corresponding to the electric field required to reach zero electric displacement, and (iii) the Curie temperature $T_{Curie}$ defined as the temperature at which a ferroelectric material undergoes a phase transition from ferroelectric to paraelectric. This phase transition temperature is typically defined as the temperature corresponding to the maximum of the real part of the complex dielectric constant for a given frequency and applied electric field.

Various piezoelectric materials may be used for energy conversion using the new power cycle of this disclosure. Single crystals and ceramics offer advantages in that they exhibit low leakage current due to high electrical resistivity, and they do not require electrical poling prior to performing an energy conversion cycle. Polymer films offer the advantage that they can sustain significantly larger electric fields.

One type of piezoelectric material is pyroelectric PMN-xPT crystal. PMN-xPT crystals possess large piezoelectric constants near the morphotropic phase boundary (MPB) separating the rhombohedral and tetragonal phases. This MPB in PMN-xPT corresponds to x between 27.5 and 33%.

Mechanical loading can change the crystal phase and domain structure and alter piezoelectric material dielectric properties. In PMN-xPT crystals, coercive field $E_c$, and remnant polarization $P_r$ decrease with increasing compressive stress.

For the demonstration of the new power cycle of this disclosure, single crystal PMN-28PT samples were selected for the advantageous piezoelectric properties. The electric field versus temperature (E-T) phase diagram of [001] PMN-28PT under zero stress indicates that the material has a monoclinic-tetragonal (M-T) phase boundary around 90° C. under zero electric field. This phase boundary temperature decreases to 85° C. and 70° C. as the electric field increases from 0 to 0.2 MV/m and 0.8 MV/m, respectively. At room temperature under zero electric field, the material is in the rhombohedral phase and undergoes a rhombohedral-monoclinic (R-M) phase transition at 0.2 MV/m.

By way of comparison, to illustrate the improved energy conversion capability of the new power cycle, an Olsen cycle is first described.

The Olsen cycle includes two isothermal and two isoelectric field transitions, where the four transitions define a cycle between four states. The first transition of the Olsen cycle is an increase in electric field from $E_L$ to $E_H$ at constant material temperature $T_{cold}$. The second transition is the heating the material from $T_{cold}$ to $T_{hot}$ under constant electric field $E_H$. The third transition is a decrease in the electric field from $E_H$ to $E_L$ at constant temperature $T_{hot}$. The cycle is closed by cooling the material from $T_{hot}$ to $T_{cold}$ under constant electric field $E_L$.

FIG. 3A illustrates the Olsen cycle superimposed on electric displacement D versus electric field E diagram (D-E diagram) for three isothermal bipolar loops. The Olsen cycle superimposed over the D-E loops includes cyclic transitions between $T_{cold}$ and $T_{hot}$, and also between low electric field $E_L$ and high electric field $E_H$, as described above. The area enclosed by the four associated state transitions corresponds to the generated energy density $N_D$, defined as the electrical energy (in Joules) produced per unit volume (in liters) of the material per cycle. It is expressed in J/L/cycle and defined as in equation (2).

$$N_D=\oint EdD \quad (2)$$

The power density $P_D$ is the amount of energy generated per unit volume per unit time. It is expressed in W/L and is defined as $P_D=N_Df$ where f is the cycle frequency.

To maximize the energy density $N_D$ generated by the Olsen cycle, the electric field span ($E_H-E_L$) should be as large as possible without causing de-poling and/or electric breakdown. Similarly, the electric displacement span should be as large as possible. To do so, material temperature $T_{hot}$ should be greater than the Curie temperature $T_{Curie}$. Thus, the cycle should be performed with material temperature $T_{hot}$ sufficiently above $T_{Curie}$ so that even a high electric field cannot re-pole the material.

Notably, however, pyroelectric crystals may crack due to thermal stresses for temperature differences in excess of 90° C., and piezoelectric crystals may experience dielectric breakdown for electric fields larger than 0.9 MV/m. Additionally, the power density of the Olsen cycle is limited by the necessarily low cycle frequency due to slow thermal relaxation transitions.

The new power cycle uses piezoelectric energy conversion, and may also use pyroelectric energy conversion. Variable uniaxial compressive stress is used to achieve improved energy and power density. In addition, material temperature may be reduced to $T_{hot}<T_{Curie}$ such that issues of cracking and breakdown may be minimized or prevented. Further, power density may be increased by increasing frequency, as the applied stress serves to speed up the heating and cooling transitions of the material.

The new power cycle may be implemented as a thermomechanical energy harvesting cycle ("new thermomechanical cycle") or, in a variation thereof, a thermally biased mechanical energy harvesting cycle ("new thermal bias cycle"). The new thermomechanical cycle is described with respect to FIGS. 3B-C, and the new thermal bias cycle variation is described with respect to FIGS. 4A-B.

FIG. 3B illustrates one example of the new power cycle, showing that the new power cycle achieves a higher energy density $N_D$ than does the Olsen cycle. In FIG. 3B, the new power cycle is projected onto the D-E plane, superimposed over the same isothermal bipolar D-E loops as shown in FIG. 3A.

Figure 3C:
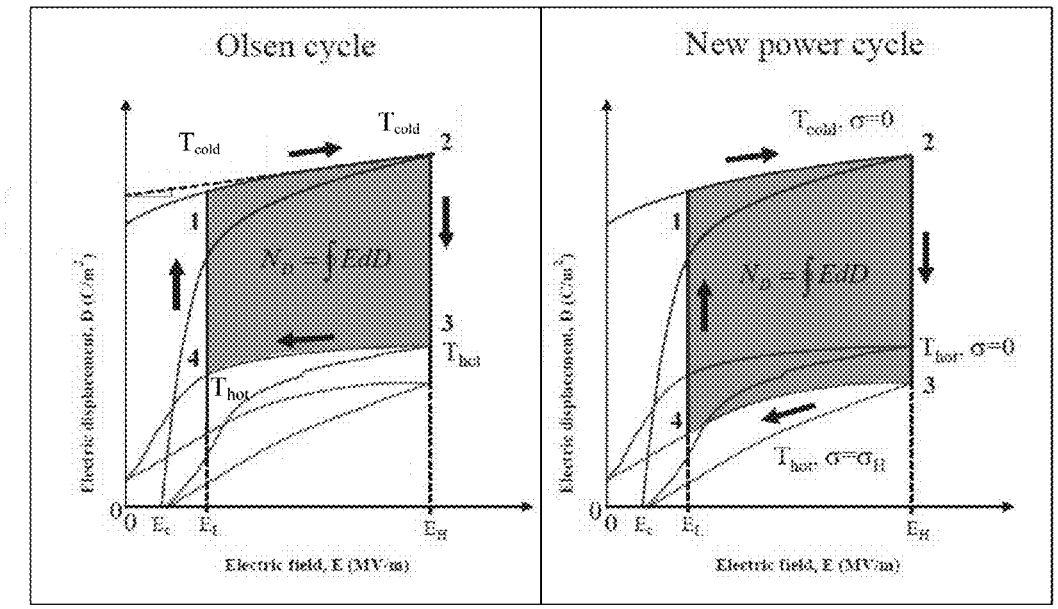
FIG. 3C illustrates an example of states and transitions of a new power cycle.
Figure 3C:
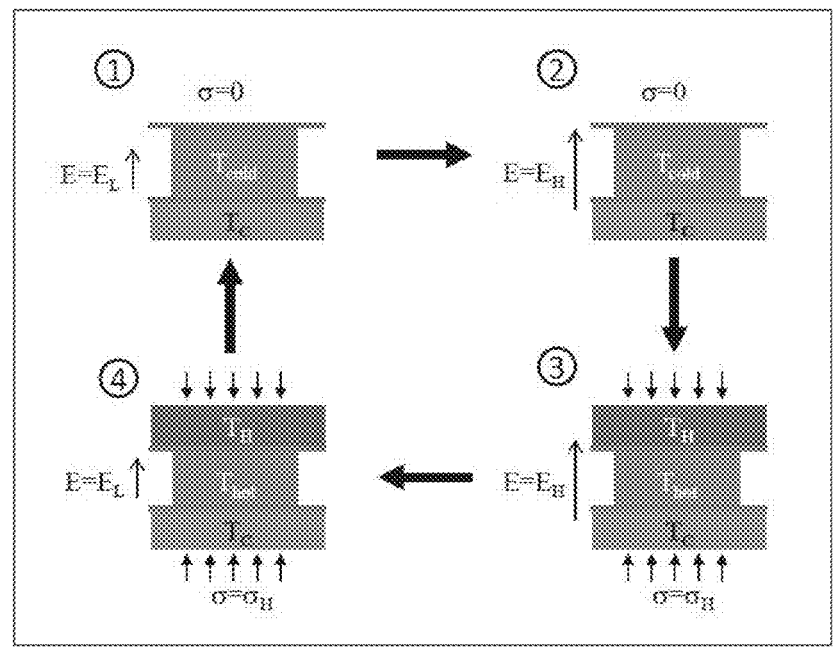

FIG. 3C is a graphic of the four states and transitions of the new thermomechanical cycle, presented visually in terms of stress, temperature, and electric field imposed in each state. For each stage of FIG. 3C, the arrow next to the electric field represents the relative magnitude of the field.

In state 1, applied stress is equal to zero, the temperature of the piezoelectric material sample is low ($T_{cold}$) due to applied temperature $T_C$, and the electric field applied is low ($E_L$). The transition from state 1 to state 2 (transition 1-2) is an increase in electric field from $E_L$ to $E_H$ at $T_{cold}$, where the transition is isothermal and in the absence of applied stress. The transition 2-3 is the simultaneous compression of the sample ($\sigma_H$) and an increase in temperature to $T_{hot}$, while the electric field remains constant at $E_H$. The transition 3-4 is a decrease in electric field from $E_H$ to $E_L$, where the transition is isothermal at $T_{hot}$ and the stress remains $\sigma_H$. The transition 4-1 closes the cycle by simultaneously cooling the sample to $T_{cold}$ and removing the stress, while electric field $E_L$ remains constant.

Cycle frequency refers to how often the complete cycle (states 1, 2, 3, and 4, and transitions 1-2, 2-3, 3-4, 4-1) may be performed. The time spent in states 1, 2, 3, and 4 is generally negligible in comparison to the time spent in transition, and therefore cycle frequency f (in Hz) is defined as approximately $f=(\tau_{12}+\tau_{23}+\tau_{34}+\tau_{41})^{-1}$ where $\tau_{ij}$ corresponds to the duration of the transition i-j. The area enclosed by the four transitions in the D-E diagram, shown in FIG. 3B, corresponds to the generated energy density $N_D$ defined by equation (2). Cycle frequency depends on material properties and material thickness, among other things. For example, in some materials, a thinner sample may allow for improved cycle frequency, as polarization may be achieved more quickly in the thinner sample. The experiments reported in this disclosure were performed at cycle frequencies of 0.025 Hz, 0.1 Hz, 0.125 Hz, 0.5 Hz, 1 Hz, 2 Hz, and 3 Hz, for example. However, other cycle frequencies are also possible. For example, cycle frequency may be in one of the ranges: greater than 0.1 Hz, greater than 0.5 Hz, greater than 1 Hz, greater than 2 Hz, greater than 5 Hz, greater than 10 Hz, greater than 50 Hz, or greater than 100 Hz, depending upon the piezoelectric material used for the energy conversion.

Figure 4A:
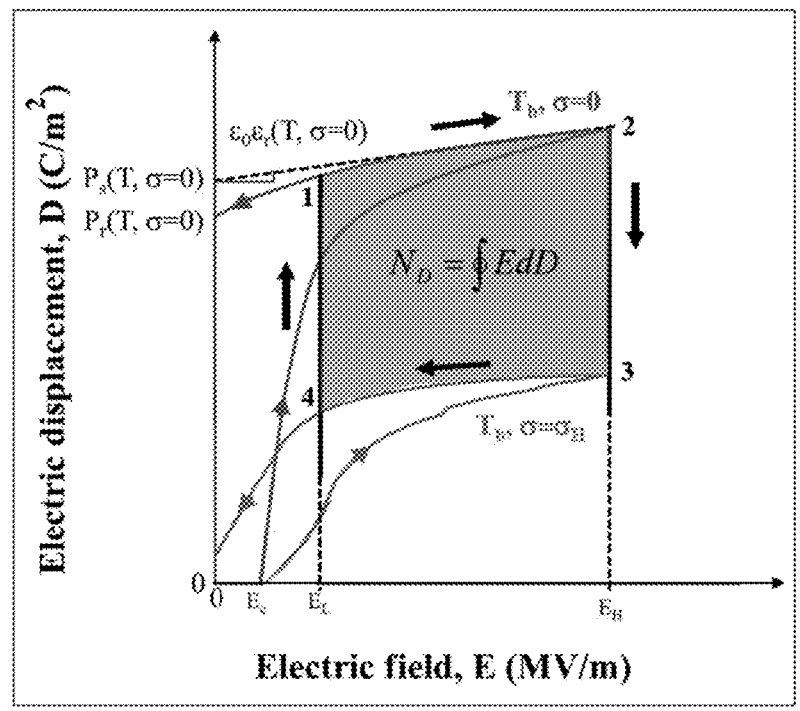
FIG. 4A illustrates an example of a new power cycle.

FIG. 4A illustrates D-E cycles for the new thermal bias cycle, which is isothermal throughout the cycle. Thus, electric field and stress are applied to effect the state transitions, but applied temperature is held constant. Generally, applied temperature is held constant such that material temperature remains at selected bias temperature $T_b$, where bias temperature $T_b$ is selected based on properties of the piezoelectric material.

Figure 4B:
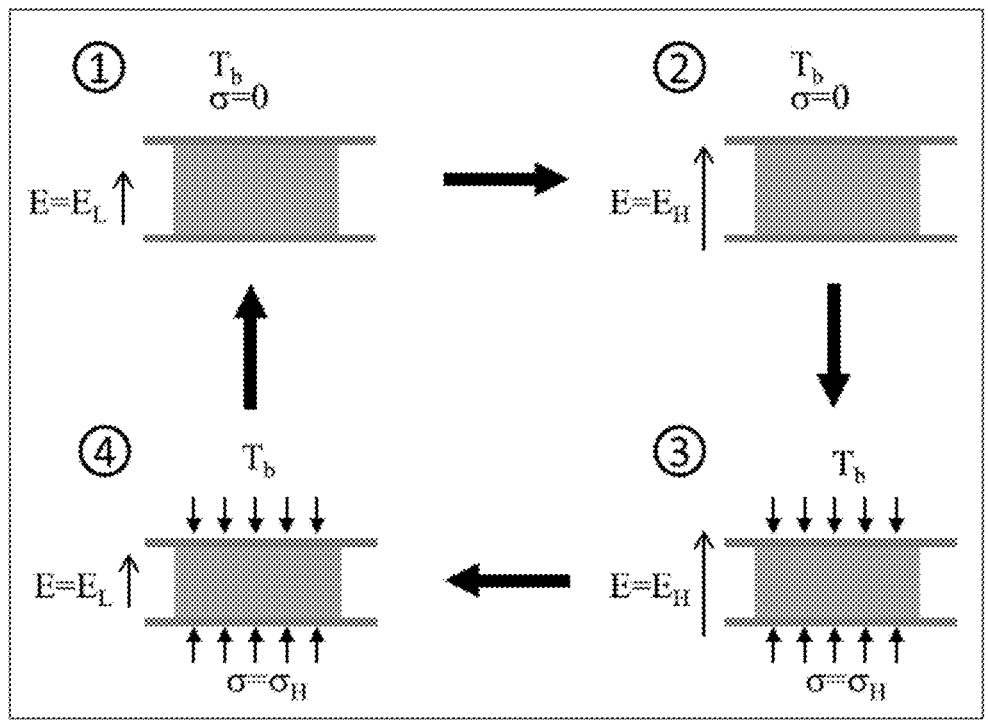
FIG. 4B illustrates an example of states and transitions of a new power cycle.

FIG. 4B is a graphic representing the four states of the cycle with transitions between states. In state 1, applied stress is equal to zero and the electric field applied is low ($E_L$). The transition 1-2 is an increase in electric field from $E_L$ to $E_H$, where the transition is in the absence of applied stress. The transition 2-3 is the compression of the sample ($\sigma_H$) while the electric field remains constant at $E_H$. The transition 3-4 is a decrease in electric field from $E_H$ to $E_L$, where the stress remains $\sigma_H$. The transition 4-1 closes the cycle by removing the stress, while electric field $E_L$ remains constant.

The efficiency of a material undergoing a power cycle is generally defined as the ratio of the energy produced by the material to the energy consumed by performing the cycle. The efficiency of the new power cycle can be expressed as $$\eta = \frac{N_D}{Q_{in} + W_{in}} \quad (3)$$

where $N_D$ is the electrical energy produced per unit volume of the material per cycle while $Q_{in}$ and $W_{in}$ are the thermal energy and mechanical work provided per unit volume of the material during the cycle.

The thermal energy consumed by the material during the cycle may be expressed, per unit volume, as $$Q_{in} = \oint \rho c_p(T) dT \quad (4)$$

where $c_p(T)$ is the specific heat of the pyroelectric material in J/kg·K and $\rho$ is the density of the pyroelectric material in kg/m³. The specific heat of pyroelectric materials $c_p(T)$ is temperature-dependent and can be estimated, for example from differential scanning calorimetry.

The mechanical work $W_{in}$ per unit volume of material can be expressed as $$W_{in} = \oint \sigma(x) d\varepsilon \quad (5)$$

where 'x' represents the strain in the longitudinal direction parallel to the polarization. For pyroelectric materials undergoing phase transitions, the relationship between $\sigma$ and x is typically non-linear, and may be estimated from stress-strain curves.

According to equation (1), the large-field dielectric constant $\varepsilon_r(T,\sigma)$ and the saturation polarization $P_s(T,\sigma)$ are functions of both temperature and compressive stress. Assuming the D-E path of the new thermal bias cycle follows that of the D-E loops at bias temperature $T_b$ both under zero and $\sigma_H$ stress, the power density of the new cycle at frequency f can be expressed as $$P_D = f(E_H - E_L) \quad (6)$$
$$\left\{\frac{\varepsilon_0}{2}[\varepsilon_r(T_b, 0) - \varepsilon_r(T_b, \sigma_H)](E_H + E_L) + P_S(T_b, 0) - P_S(T_b, \sigma_H)]\right\}$$

Equation (6) presents a model that could enable the rapid determination of the power density of materials undergoing the new thermal bias cycle from intrinsic dielectric properties of PMN-28PT without physically having to perform the cycle.

EXPERIMENTS

Experimental Setups

Experimental Setup: Samples

PMN-28PT was chosen to demonstrate the advantages of the new power cycle for its strong piezoelectric response over a broad temperature range. Single crystal samples of PMN-28PT were purchased from Sinoceramics, LLC. The dimensions of the samples were 5×5×3 mm³. The average weight of the samples was 588.5±0.8 mg, corresponding to a density of $\rho$7847±11 kg/m³. The samples were poled in the [001]-direction. The two 5×5 mm² faces of each sample were entirely coated with Cr/Au electrodes. Two strain gages were mounted to opposite 5×3 mm² faces of one of the samples to measure longitudinal strain (parallel to the polarization direction).

Experimental Setup: Thermomechanical Energy Harvesting Cycle

Figure 5:
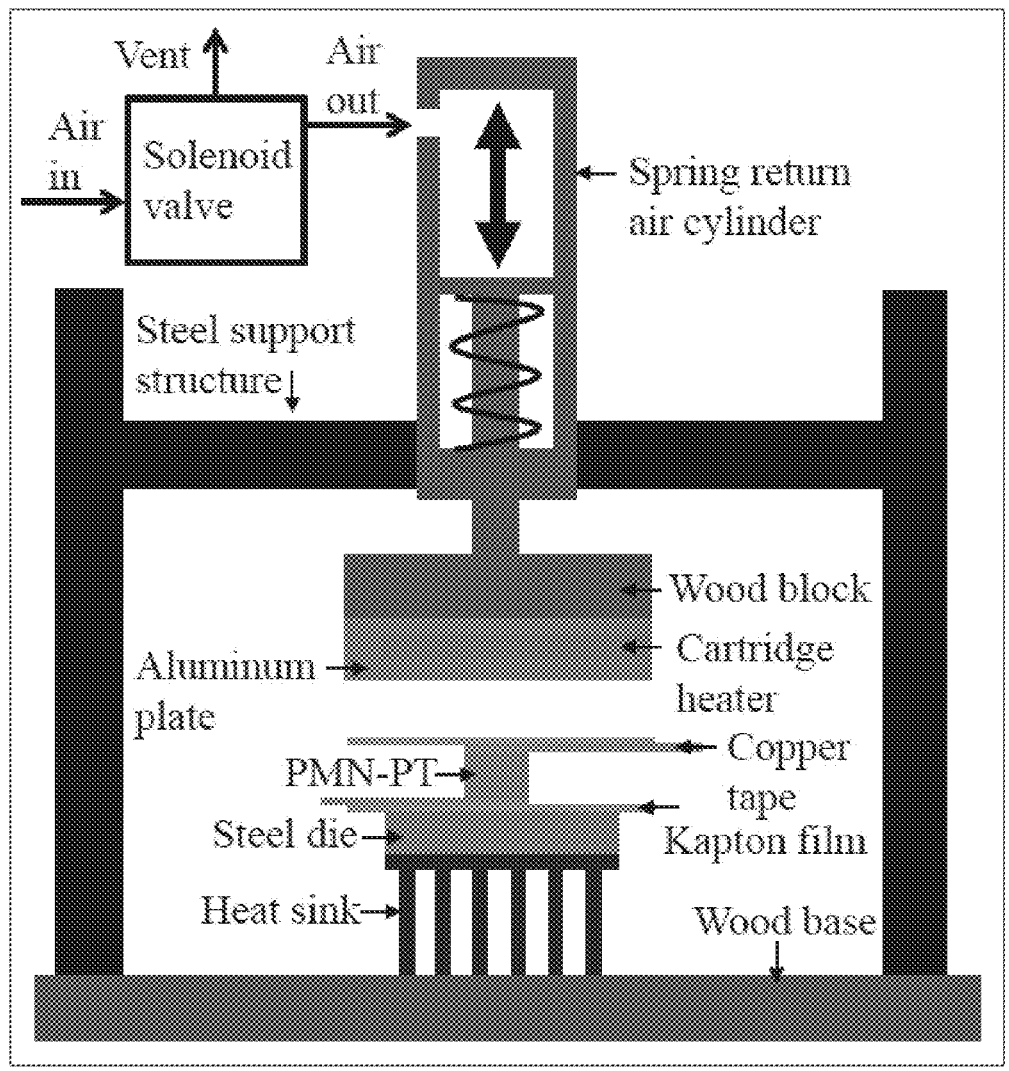
FIG. 5 illustrates an example of a testing device.

FIG. 5 illustrates a diagram of a setup used to perform experiments related to the new thermomechanical cycle. A spring return air cylinder (McMaster-Carr 6498K252) was vertically actuated using compressed air at a maximum pressure of 469 kPa. A 24 V DC solenoid valve was used to control the extension and contraction of the cylinder rod. A 100 W cartridge heater was embedded in a 1.27 cm thick aluminum plate serving as a heat source. A type-K thermocouple was embedded at the center of this heating block, whose temperature was maintained at $T_H$ with an Omega CN-7823 proportional integral derivative (PID) temperature controller. The PMN-28PT sample was sandwiched between two copper tapes used to provide electrical contact between the sample's electrodes and the wires. This assembly was placed on top of a 5 mm thick steel die. An aluminum heat sink (Cool Innovations 3-151514M) was placed in thermal contact with the steel die by epoxy adhesive (OMEGA-BOND® 200) to passively cool the pyroelectric sample to $T_{cold}$ during the transition 4-1. A 0.14 mm thick Kapton film was used to electrically isolate the sample's electrodes from the metallic heat source and sink. Note that the sample temperature could not be measured during electric field cycling due to electrical conduction between the sample and the thermocouple. An electrical system (not shown) was used to control the cycles and take measurements. The electrical system included a Sawyer-Tower circuit that measures electric field and electric displacement.

Experimental Setup: Thermal Bias Mechanical Energy Harvesting Cycle

Figure 6:
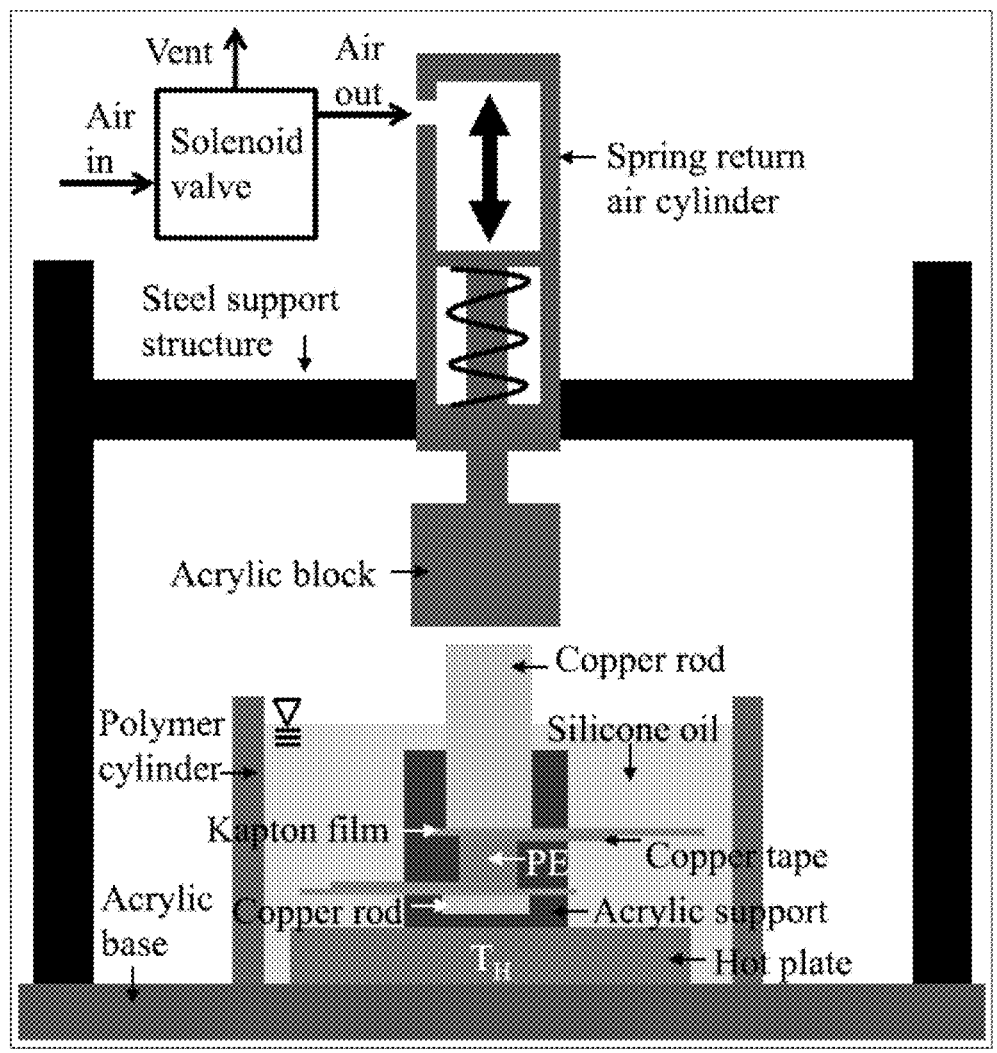
FIG. 6 illustrates an example of another testing device.
Figure 7A:
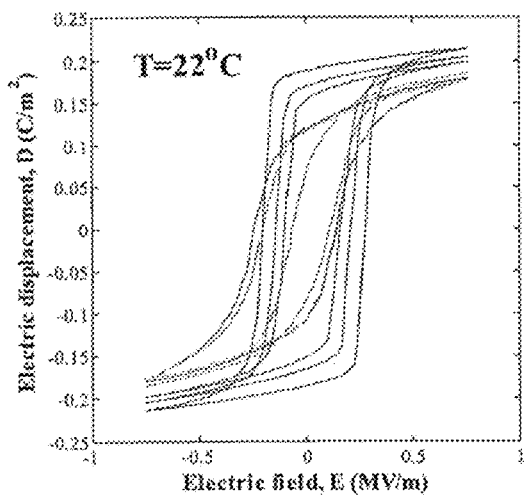
FIGS. 7A-D illustrate examples of isothermal D-E cycles.
Figure 7B:
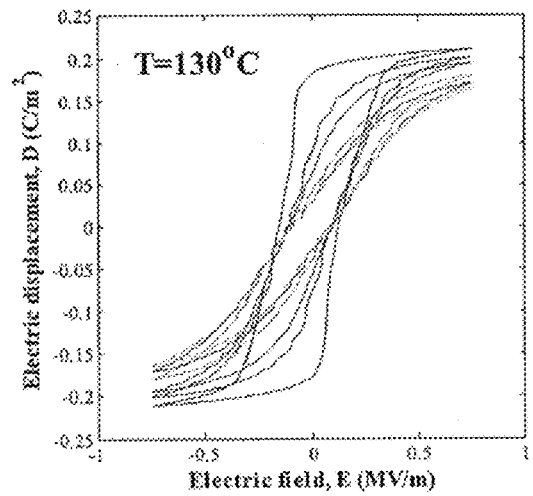
Figure 7C:
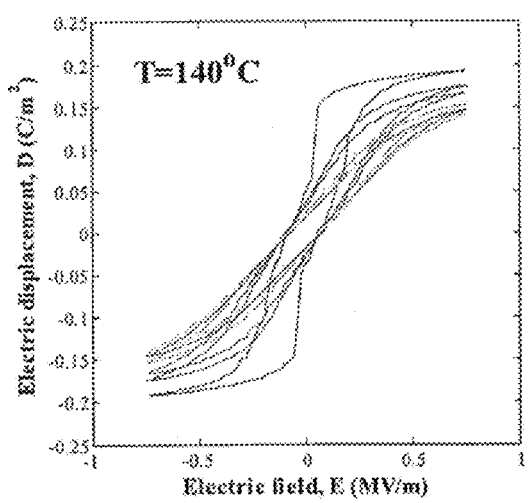
Figure 7D:
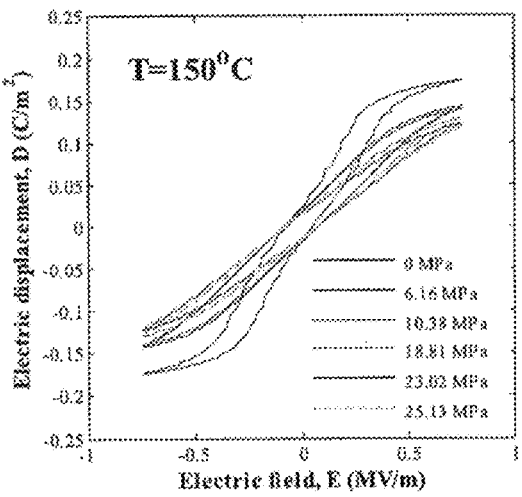
Figure 8A:
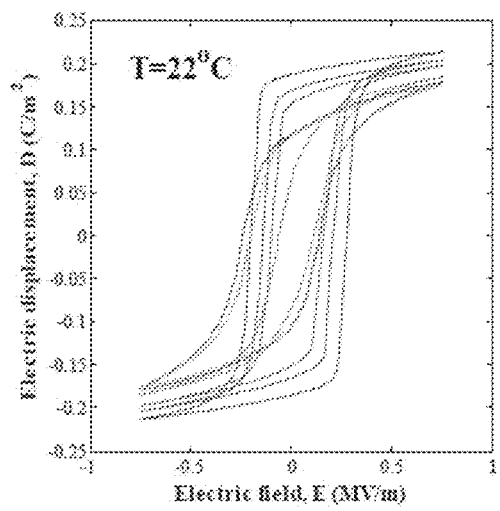
FIGS. 8A-D illustrate examples of isothermal D-E cycles.
Figure 8B:
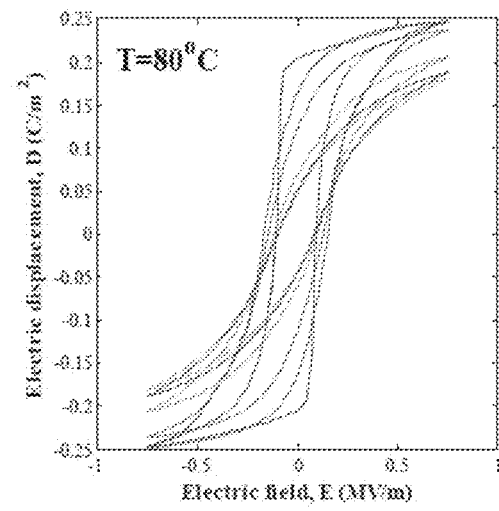
Figure 8C:
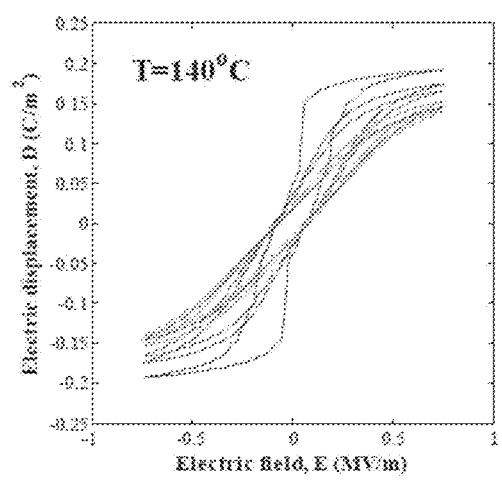
Figure 8D:
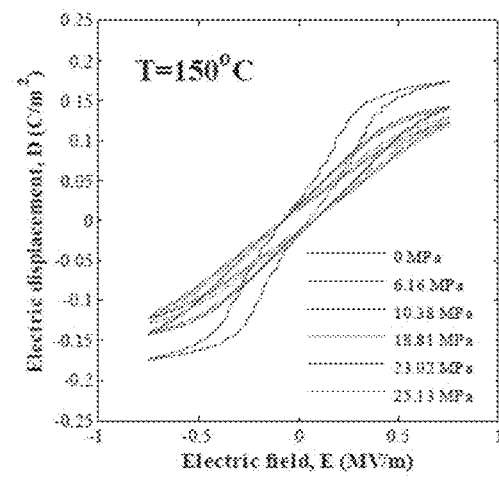

FIG. 6 illustrates a diagram of a setup used to perform experiments related to the new thermal bias cycle. A spring return air cylinder (McMaster-Carr 6498K252) vertically actuated using compressed air at a maximum pressure of 469 kPa. A 24V DC solenoid valve was used to control the extension and contraction of the cylinder rod applying pressure on the sample between two copper rods. The PMN-28PT sample was sandwiched between two copper tapes used to provide electrical contact between the sample's electrodes and the wires. A 0.14 mm thick Kapton film was used to electrically isolate the sample's electrodes from the copper rods. The sample was placed inside an acrylic support structure submerged in a heated silicone oil bath. A 100-Watt cartridge heater was imbedded in a 1.27 cm thick aluminum plate serving as a heat source to the oil bath. A type-K thermocouple was embedded at the center of this heating block whose temperature was maintained at $T_H$ with an Omega CN-7823 proportional integral derivative (PID) temperature controller. The corresponding sample bias temperature $T_b$ was measured by a type-K thermocouple placed on the sample. After the desired steady-state temperature was reached, this second thermocouple was removed prior to performing the cycle so that it did not electrically interfere with electrical measurements performed on the sample. In addition, a servo-hydraulic test frame was used in place of the spring return air cylinder for mechanical characterization of the sample during the cycle. The electrical system included a Sawyer-Tower circuit that measures electric field and electric displacement. The compressive force applied by the servo-hydraulic mechanism was computer-controlled, enabling strain to be measured as a function of stress while also simultaneously measuring electric field and electric displacement.

Experimental Setup: Isothermal D-E Loops

A variation of the setup illustrated in FIG. 5 was also used for experiments related to collecting isothermal D-E loops under different (static) compressive stress. The setup was modified in that the heat sink and steel die were replaced with a wood block and an aluminum heating plate, respectively, similar (but inverted) to the wood block and heat source placed above the sample. The sample was uniformly heated to $T_{hot}$ from both sides in this manner, to minimize the temperature gradient in the sample. A type-K thermocouple placed directly on the sample was used to measure the sample temperature, and removed before electric field cycling began. The heater temperature $T_H$ was approximately 27° C. greater than the sample temperature under steady-state conditions due to the low thermal conductivity of the electrically insulating Kapton film (k=0.12 W/m K).

Additionally, the setup of FIG. 6 was used for experiments related to collecting isothermal D-E loops under different (static) compressive stress.

Experimental Setup: Sample Temperature

The setup of FIG. 5 was also used to test sample temperature as a function of time for various cycle frequencies. Thermomechanical cycling was performed without electric field cycling for the above conditions on one of the samples in order to measure the sample temperature oscillations. To do so, a type-K thermocouple was bonded with OMEGA-BOND® 101 to the center of one of the 3×5 mm² faces for one of the samples.

Experimental Setup: Specific Heat

Differential scanning calorimetry (DSC) was performed using a Diamond DSC from Perkin Elmer, USA to determine the specific heat $c_p(T)$ of PMN-28PT. The specific heat is defined as $$c_p = \frac{\dot{Q}_{DSC}}{m\dot{T}} \quad (6)$$

where $\dot{Q}_{DSC}$ is the heat transfer rate provided to the sample and measured by the DSC (in W), m is the sample mass (in kg), and $\dot{T}=dT/dt$ is the heating rate expressed in ° C./s. The instrument was calibrated using an indium standard purchased from Perkin Elmer, USA. The melting temperature at atmospheric pressure and specific phase change enthalpy were measured to be 160.82° C. and 26.94 J/g, respectively (i.e., within 2.7% and 5.6%, respectively, of the indium properties reported in literature).

Experimental Procedures

Experimental Procedures: Thermomechanical Energy Harvesting Cycle

Isothermal bipolar D-E loops of [001] PMN-28PT were collected for temperatures of 22° C., 130° C., and 140° C. and 150° C., at values of static compressive stress ranging from 0 to 25.13 MPa. Measurements were taken by applying a triangular voltage signal at 0.1 Hz across the single crystal samples. The amplitude of the applied voltage corresponded to an electric field varying from −0.75 to 0.75 MV/m. All measurements were repeated three times to assess repeatability and to estimate the experimental uncertainty.

The new thermomechanical cycle was performed with the duration of the transitions being $\tau_{12}=\tau_{34}$ and $\tau_{23}=\tau_{41}$, where $\tau_{23}=7*(\tau_{12})$. The frequency ranged from 0.025 to 1 Hz by varying $\tau_{23}$ between 17.5 and 0.438 seconds (and correspondingly varying $\tau_{12}$). The cold source temperature $T_C$ was passively maintained near room temperature (approximately 22° C.) and did not exceed 30° C. The hot source temperature $T_H$ varied from 60° C. to 217° C. The low electric field $E_L$ was fixed at 0.2 MV/m. The high electric field $E_H$ varied from 0.75 to 0.95 MV/m. The uniaxial stress $\sigma_H$ applied during transitions 2-3 and 3-4 ranged from 0 to 33.56 MPa.

Experimental Procedure: Thermal Bias Mechanical Energy Harvesting Cycle

Isothermal bipolar D-E loops of [001] PMN-28PT were collected for applied temperatures of 22° C., 80° C., and 140° C. and 150° C., at values of static compressive stress ranging from 0 to 25.13 MPa. The dielectric properties of PMN-28PT were estimated from the isothermal bipolar D-E loops. The saturation polarization $P_s(T,\sigma)$ and the large-field dielectric constant $\varepsilon_r(T,\sigma)$ were evaluated by linearly fitting the bipolar D-E loops corresponding to a decrease in electric field from 0.75 MV/m to 0.5 MV/m according to equation (1).

The new thermal bias cycle was performed so that the duration of each transition was equal, i.e., $\tau_{12}=\tau_{23}=\tau_{34}=\tau_{41}$. The new thermal bias cycle was executed for frequency f ranging from 0.5 Hz to 3 Hz by varying $\tau_{ij}$ between 1 second and 0.083 second, respectively. The uniaxial stress $\sigma_H$ applied during transitions 2-3 and 3-4 ranged from 0 to 35.67 MPa. The low and high electric fields $E_L$ and $E_H$ were fixed at 0.2 MV/m and 0.8 MV/m, respectively.

In addition, the new thermal bias cycle was performed at very low cycle frequency (f≈0.004 Hz) in the servo-hydraulic test frame, while the electric field, electric displacement, stress, and strain were simultaneously measured. The load frame measured the applied force ranging from 0 to 850 Newtons corresponding to stress of 0 to 34 MPa. The energy density $N_D$ generated per cycle was evaluated by numerically integrating experimental data for D versus E according to equation (3) using the trapezoidal rule. The mechanical work $W_{in}$ done per cycle was evaluated by numerically integrating experimental data for $\sigma$ versus $\in$ according to equation (5) using the trapezoidal rule. Finally, the material efficiency $\eta$ given by equation (2) was estimated.

Experimental Procedure: Comparison Experiments

By way of comparison, experiments were also performed using the Olsen cycle, to determine a maximum energy density with cold source temperature $T_C$ set at 22° C. and hot source temperature $T_H$ ranging from 80 to 170° C. The electric fields $E_L$ and $E_H$ were fixed at 0.2 MV/m and 0.75 MV/m, respectively. The, cycle frequency f was dependent on $T_H$ based on the amount of time necessary for the sample's electric displacement to reach a minimum or maximum during the heating and cooling transitions, respectively.

Experimental Results

Experimental Results: Isothermal D-E Loops

FIGS. 7A-D illustrate results of experiments for collecting isothermal bipolar D-E loops using the test structure of FIG. 5 with modifications as described above for isothermal testing. The loops were measured at 0.1 Hz for one sample at 22° C., 130° C., 140° C., and 150° C. (FIGS. 7A-D, respectively) under mechanical loading between 0 and 25.13 MPa. FIGS. 7A-D illustrate the effect of compressive stress on the D-E loops. The isothermal D-E loops were closed and consecutive D-E loops overlapped for the temperature and compressive stress considered. This indicates that leakage current through the sample was negligibly small. The nonlinearities in D-E loops, observed as the electric field was reduced from 0.75 MV/m to 0.0 under zero stress, correspond to electric field induced phase transitions—tetragonal to monoclinic Mc phase transition at 80° C. and 0.4 MV/m, tetragonal to cubic phase transition at 130° C., 140° C., 150° C., and 160° C. at electric fields 0.01 MV/m, 0.1 MV/m, 0.18 MV/m, and 0.25 MV/m, respectively. At T=170° C. (not shown), the sample remained in the paraelectric pseudocubic phase for all electric fields considered, and compressive stress had negligible effect on the D-E loops.

FIGS. 8A-D illustrate results of experiments for collecting isothermal bipolar D-E loops using the test structure of FIG. 6. The loops were measured at 0.1 Hz for one sample at 22° C., 80° C., 140° C., and 150° C. (FIGS. 8A-D, respectively) under mechanical loading between 0 and 25.13 MPa. As can be seen, the results are consistent using either experimental setup (FIG. 5 modified, or FIG. 6).

Experimental Results: Specific Heat

Figure 9:
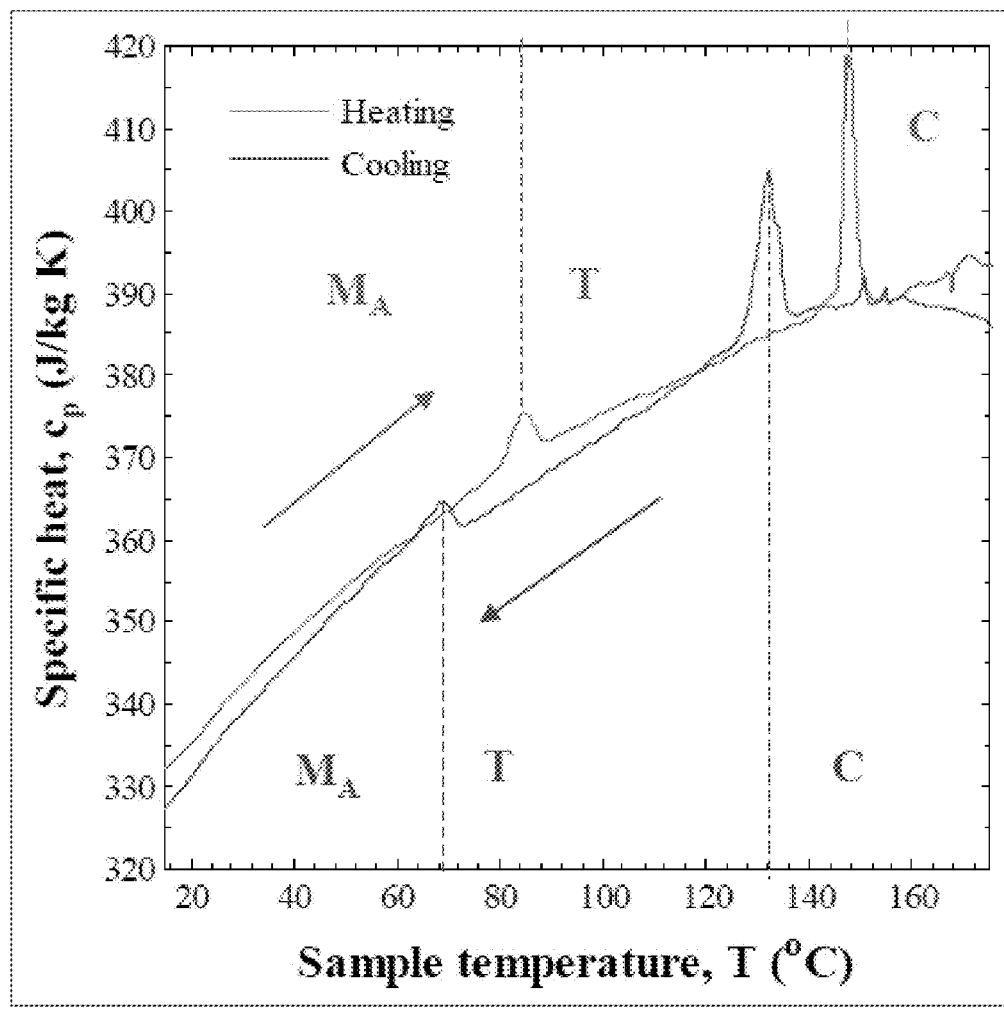
FIG. 9 illustrates specific heat of a pyroelectric component.
Figure 10A:
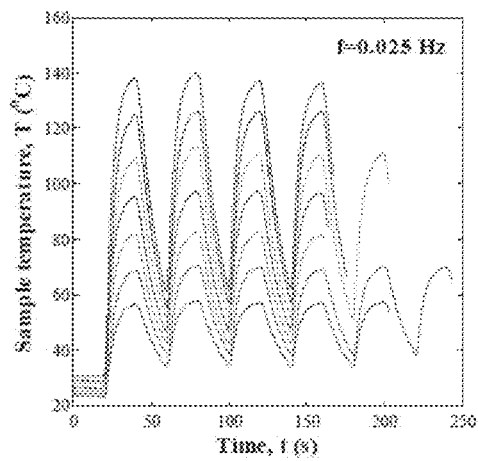
FIGS. 10A-D illustrate sample temperature of a pyroelectric component.
Figure 10B:
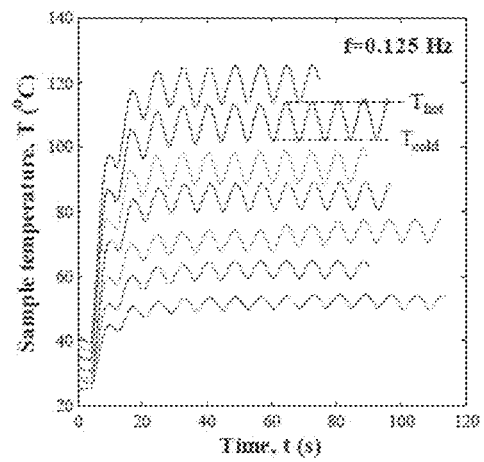
Figure 10C:
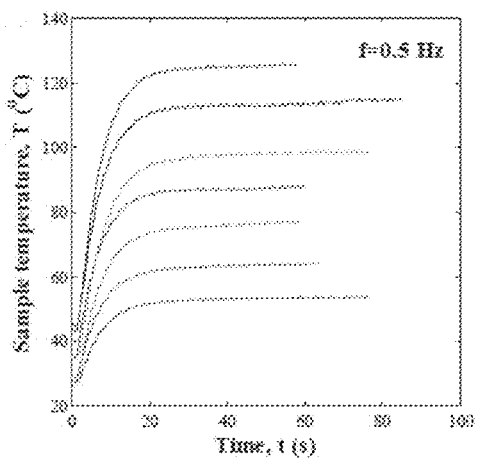
Figure 10D:
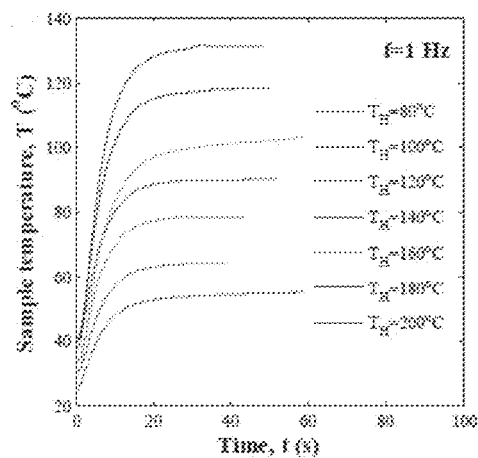

FIG. 9 plots the specific heat $c_p(T)$ as a function of temperature T between 20° C. and 180° C., followed by cooling from 180° C. to 20° C. The PMN-28PT sample exhibited peaks in $c_p$ at the phase transition temperatures corresponding to 90° C. and 150° C. during heating and 135° C. and 70° C. during cooling.

Experimental Results: Sample Temperature

FIGS. 10A-D illustrate the results of sample temperature experiments, without electric field variation, showing temperature oscillations of a PMN-28PT sample for frequencies of 0.025 Hz, 0.125 Hz, 0.5 Hz, and 1 Hz, respectively, for heater temperatures $T_H$ varying from 80 to 200° C. For each heater temperature, it took approximately 40 seconds for sample temperature to reach oscillatory steady-state. For a given frequency, the peak to peak temperature span and the maximum and minimum sample temperatures $T_{hot}$ and $T_{cold}$, respectively, increased with increasing heater temperature $T_H$.

Figure 11A:
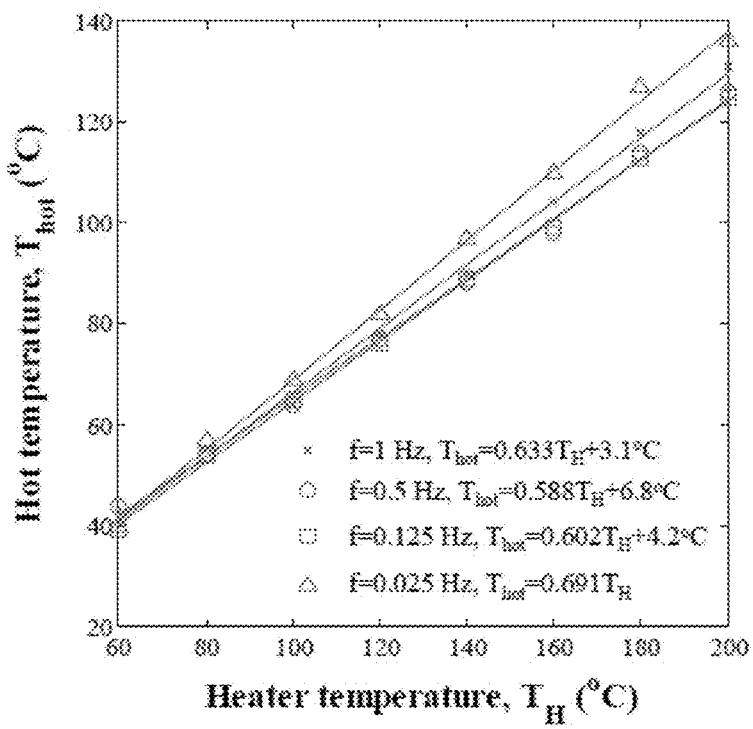
FIGS. 11A-B illustrate sample temperature of a pyroelectric component.
Figure 11B:
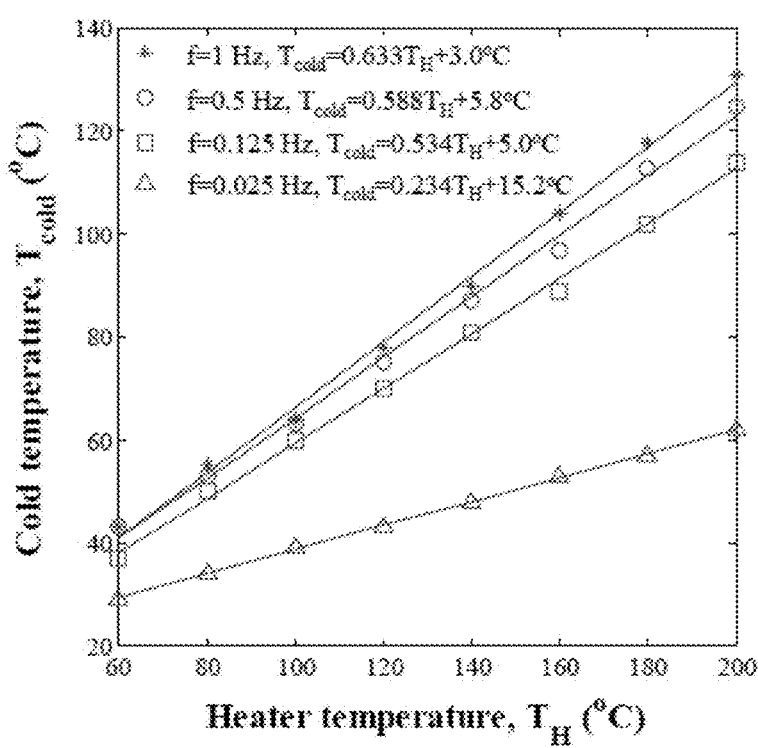

FIGS. 11A-B show sample temperature for sample temperatures $T_{hot}$ and $T_{cold}$ as a function of heater temperature for frequency varying from 0.025 Hz to 1 Hz. Each data point corresponds to the arithmetic mean of $T_{hot}$ and $T_{cold}$ measured over five consecutive cycles in the oscillatory steady-state regime. The solid lines correspond to the linear fit of $T_{hot}$ or $T_{cold}$ versus $T_H$ for a given frequency. This fit was used to compute calibrations for $T_{hot}$ or $T_{cold}$ for given heater temperatures and cycle frequencies. Note that, for f>0.5 Hz, $T_{hot}$ is approximately equal to $T_{cold}$. The temperature of a sample during cycling was found to be independent of compressive stress for a given heater temperature.

Experimental Results: Thermomechanical Energy Harvesting Cycle

Figure 12A:
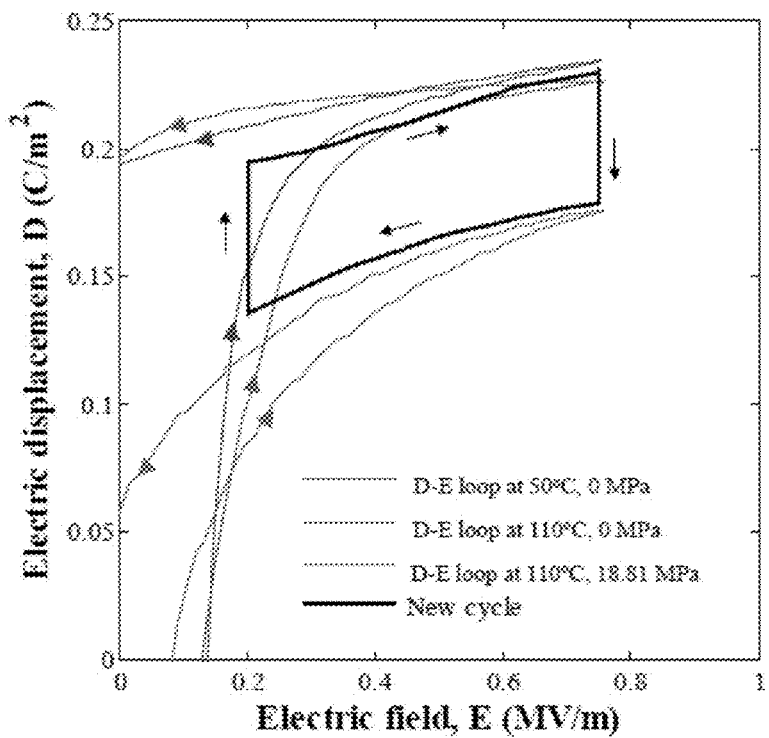
FIGS. 12A-B illustrate D-E diagrams for a new power cycle.
Figure 12B:
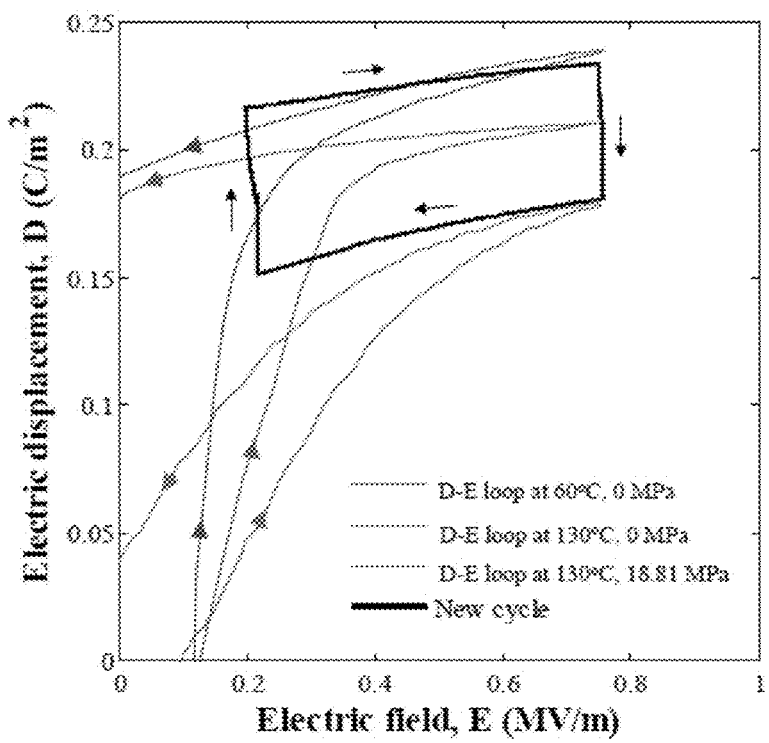

FIGS. 12A-B depicts, in a D-E diagram, the new thermomechanical cycle performed at 0.025 Hz superimposed over isothermal D-E loops. FIG. 12A illustrates variation between source temperatures $T_C$=22° C. and $T_H$-157° C., corresponding to sample temperatures $T_{cold}$=52° C. and $T_{hot}$=109° C. FIG. 12B illustrates variation between source temperatures $T_C$=22° C. and $T_H$=187° C., corresponding to sample temperatures $T_{cold}$=59° C. and $T_{hot}$=129° C. Based on the sample temperature calibration curves (FIGS. 10A-D), the sample did not reach the cold source temperature of 22° C., and instead, cooled to approximately 52° C. (FIG. 12A) and 59° C. (FIG. 12B) during transition 4-1 and before the transition 1-2 began. For both cycles (FIGS. 9A, 9B), the electric field was cycled between $E_L$=0.2 MV/m and $E_H$=0.75 MV/m. A compressive stress of $\sigma_H$=18.81 MPa was applied during transitions 2-3 and 3-4. The examples of new thermomechanical cycles plotted in FIGS. 12A-B generated energy densities of 24.0 J/L and 33.6 J/L, respectively.

The Olsen cycle performed under similar operating conditions would yield much lower energy densities. Indeed, it is evident that for $T_{cold}$=50° C. and $T_{hot}$=110° C., the Olsen cycle would generate no energy. For $T_{cold}$=60° C. and $T_{hot}$=130° C., the Olsen cycle would generate approximately half of the energy density of the new cycle.

Figure 13:
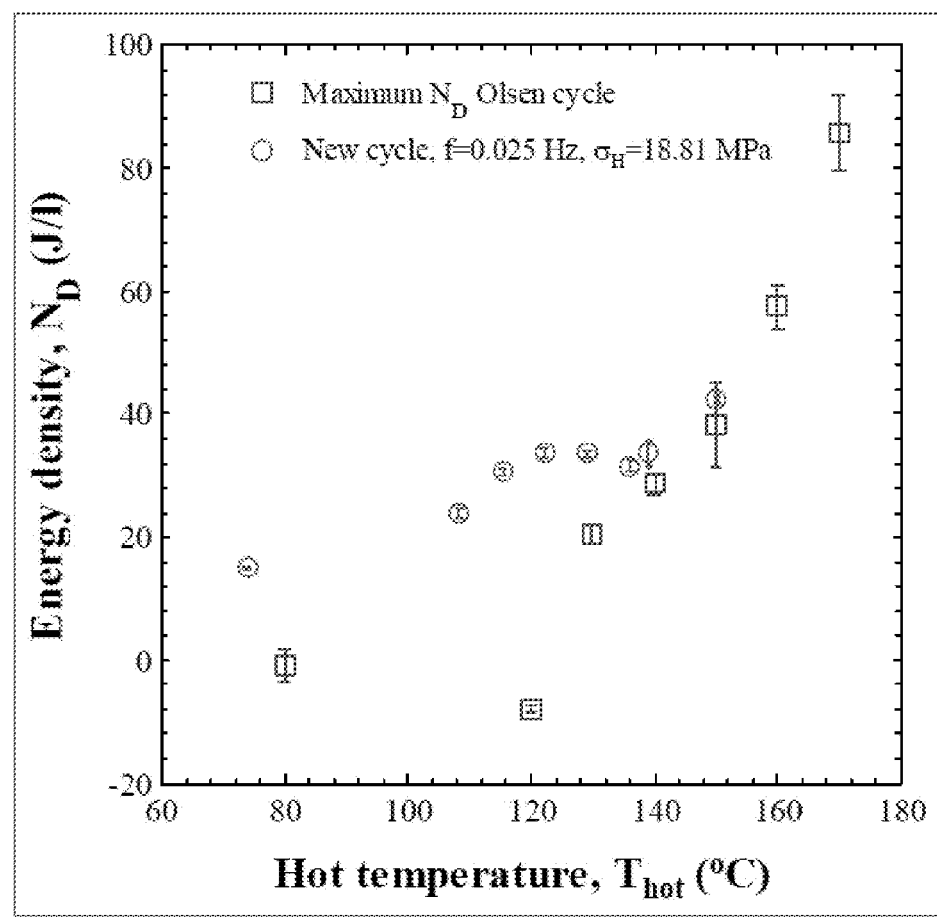
FIG. 13 illustrates energy density of a new power cycle as a function of material temperature.

FIG. 13 plots the energy density experimentally generated by the new thermomechanical cycle at frequency 0.025 Hz in comparison with the maximum energy density generated by the Olsen cycle at frequencies ranging from 0.013 Hz to 0.021 Hz as a function of temperature $T_{hot}$ between 80° C.

and 170° C. Each data point represents an average over four cycles and the error bars correspond to one standard deviation or 63% confidence interval. The error bars associated with the Olsen cycle were larger because it was not automated. FIG. 13 shows that, for $T_{hot}$ between 80° C. and 150° C., the energy density generated by the new power cycle was larger than that generated by the Olsen cycle. In fact, the Olsen cycle did not generate positive energy density for $T_{hot}$ below 130° C.

Figure 14:
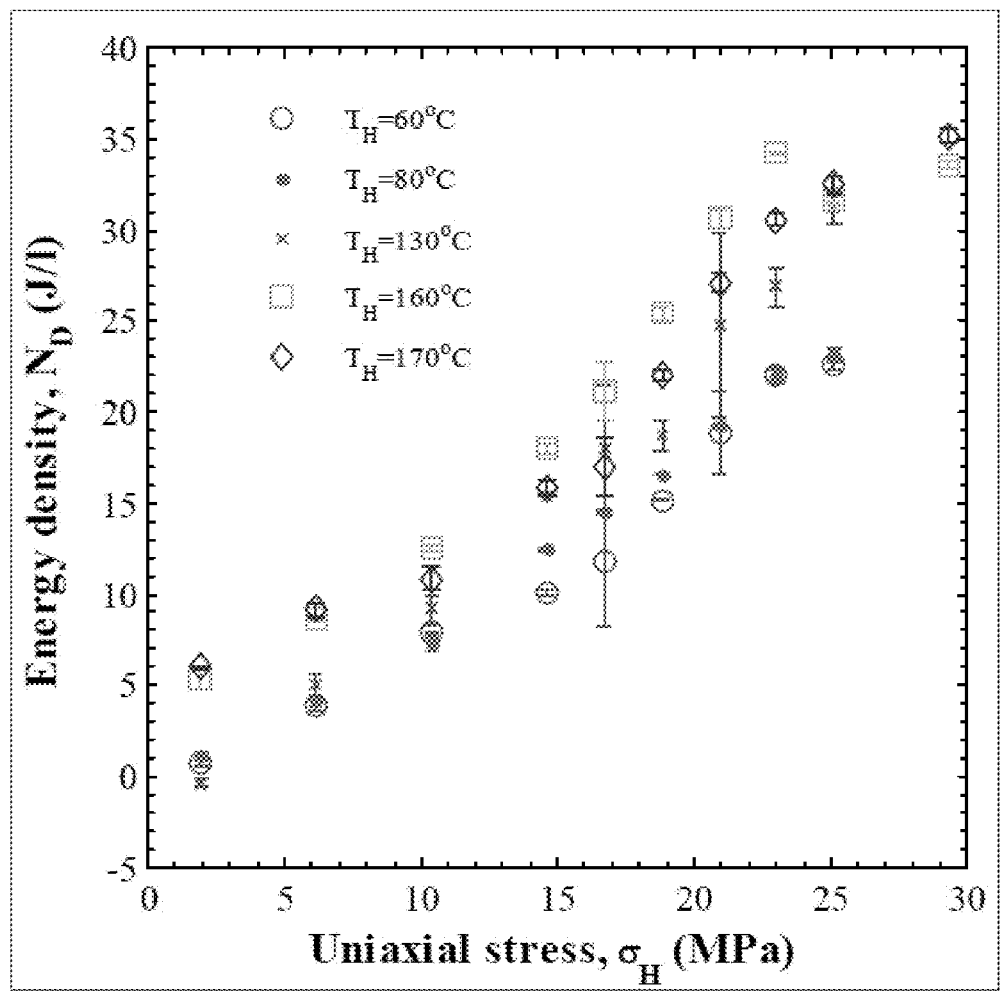
FIG. 14 illustrates energy density of a new power cycle as a function of stress.

FIG. 14 shows the generated energy density of the new thermomechanical cycle as a function of applied compressive stress $\sigma_H$ for heater temperatures $T_H$ varying between 60° C. and 170° C. Here, the frequency was fixed at 0.125 Hz while the electric field was cycled between 0.2 and 0.75 MV/m. Energy density increased nearly linearly with increasing $\sigma_H$ for any given heater temperature $T_H$. For heater temperature $T_H$=160° C., the sample temperature calibration curve at 0.125 Hz predicted $T_{cold}$=92° C., corresponding to the temperature at which [001] PMN-28PT is in the tetragonal phase and exhibits the highest saturation polarization under zero stress. On the other hand, for $T_H$=170° C. the calibration curve predicts $T_{cold}$=96° C., corresponding to the pseudocubic phase featuring a smaller saturation polarization than the tetragonal phase under zero stress. Thus, the energy density generated at 0.125 Hz for a given compressive stress was the largest with $T_H$ equal to 160° C.

Figure 15A:
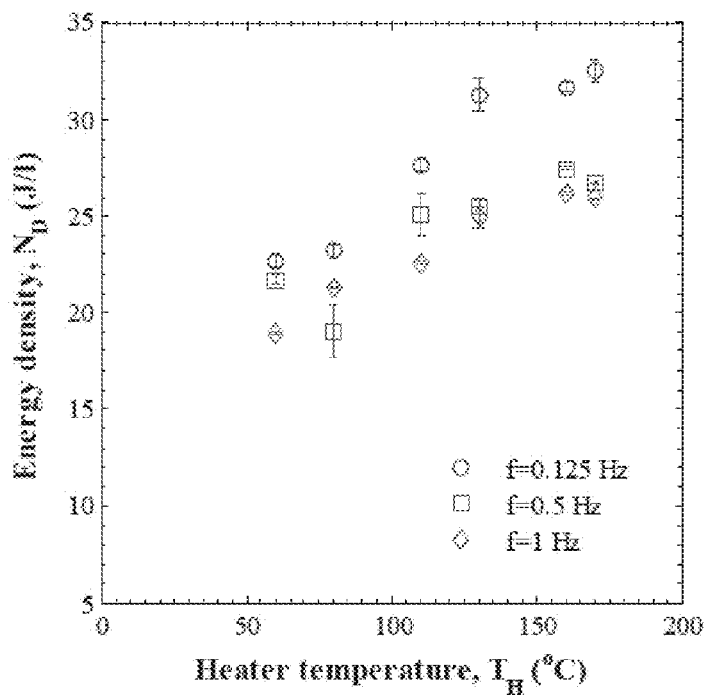
FIG. 15A illustrates energy density of a new power cycle as a function of heater temperature.

FIG. 15A shows the energy density generated using the new power cycle as a function of heater temperature $T_H$ for frequency 0.125 Hz, 0.5 Hz, and 1 Hz. The high applied stress $\sigma_H$ was fixed at 25.13 MPa, the low and high electric fields $E_L$ and $E_H$ were set at 0.2 MV/m and 0.75 MV/m, respectively, and the cold source temperature $T_C$ was 22° C. The energy density increased with increasing heater temperature for any given frequency. In addition, it decreased only slightly with increasing cycle frequency, because the change in electric displacement as a result of a change in compressive stress occurred quickly and was nearly similar for all frequencies. Moreover, longer heating and cooling durations at lower cycle frequency allowed the slow thermal relaxation transitions to take place. This enabled more charge to build up at the electrode surfaces during transition 4-1 resulting in the largest $N_D$ generated for $T_H$ above 110° C. at 0.125 Hz. In fact, the difference between $T_{cold}$ and $T_{hot}$ was around 10° C. at 0.125 Hz, while it was less than 1° C. at higher cycle frequency.

Figure 15B:
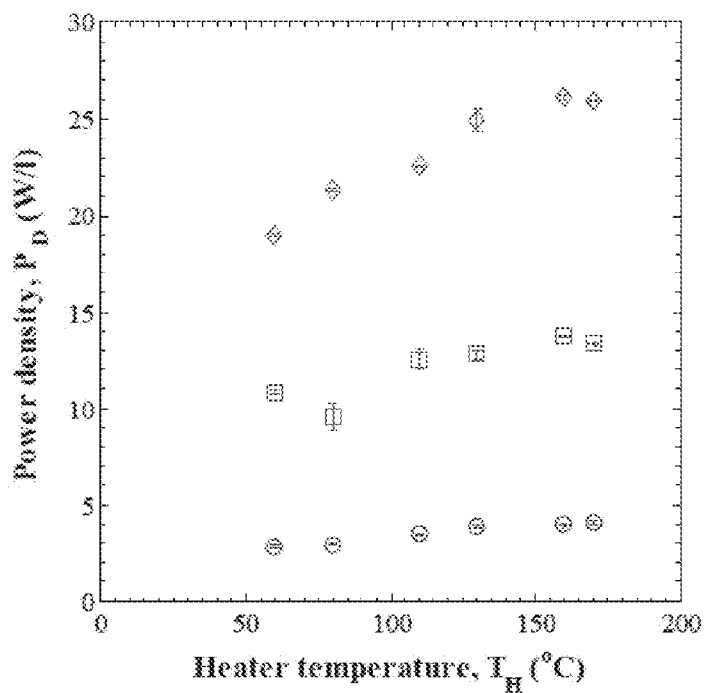
FIG. 15B illustrates power density of a new power cycle as a function of heater temperature.

FIG. 15B shows the power density as a function of heater temperatures for the data used as the basis of FIG. 15A. Increasing the cycle frequency resulted in increased power density. In fact, the power density at 1 Hz was nearly ten times larger than that at 0.125 Hz for heater temperature $T_H$ above 100° C. This can be attributed to the fact that $N_D$ did not decrease significantly as the frequency increased by a factor of eight.

Figure 16A:
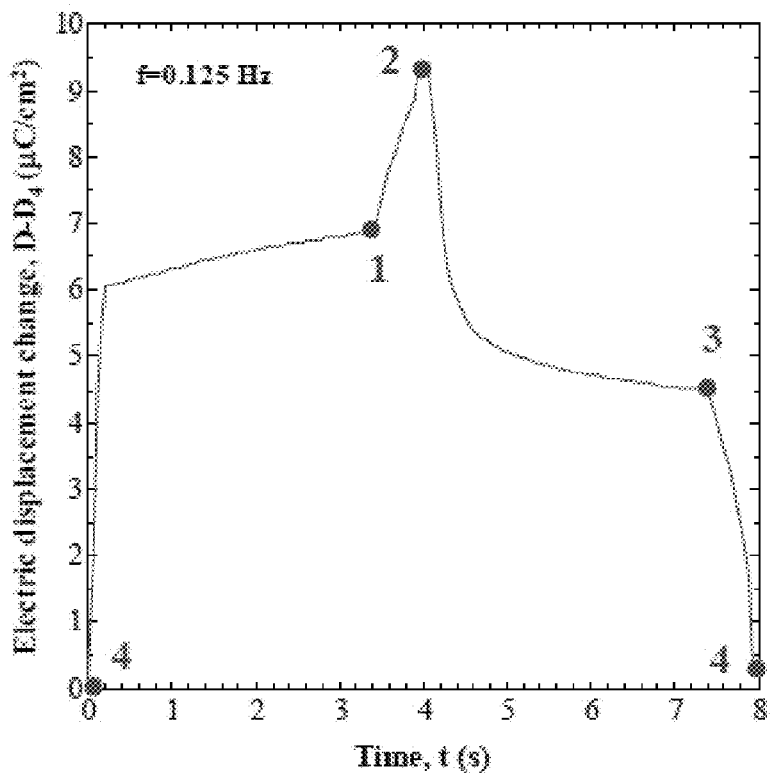
FIGS. 16A-B illustrate electric displacement of a new power cycle.
Figure 16B:
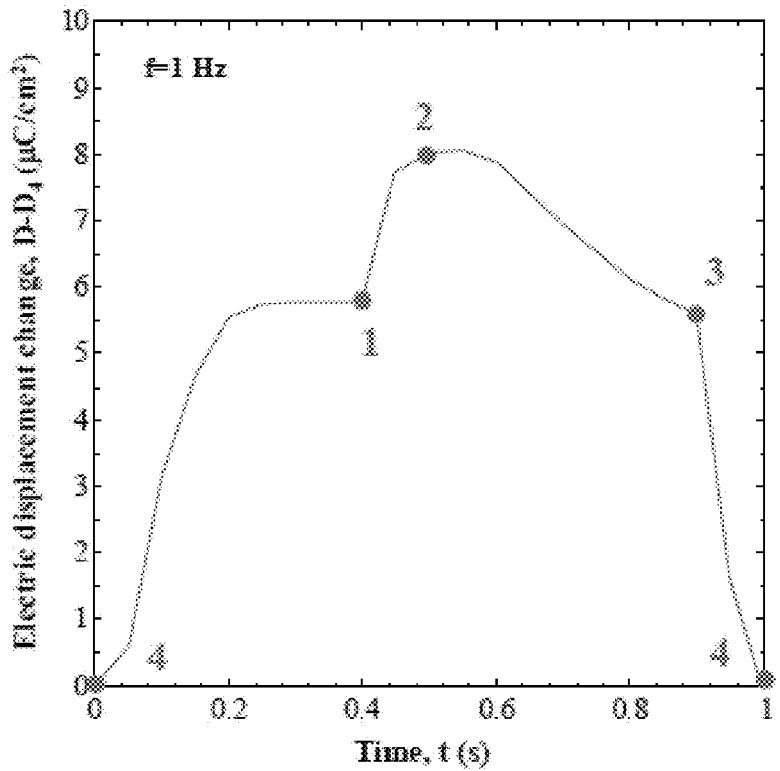

FIGS. 16A-B show electric displacement variations versus time t for representative new thermomechanical cycles performed at frequency 0.125 and 1 Hz, respectively. In both cases, the heater temperature $T_H$ was maintained at 160° C., the low and high electric fields $E_L$ and $E_H$ were set at 0.2 MV/m and 0.75 MV/m, respectively, and the compressive stress was $\sigma_H$=25.13 MPa. The states 1-4 of the cycle are indicated. For comparison, the two cycles are aligned to state 4. The cycle of FIG. 16A at 0.125 Hz illustrates the piezoelectric and pyroelectric contributions to the cycle. During transition 4-1, approximately 85% of the change in electric displacement corresponding to an increase from 0 to 6 $\mu C/cm^2$ occurring in the first 0.25 seconds. This change in displacement can be attributed to the change in compressive stress from $\sigma_H$ to $\sigma$=0 MPa. The remaining 15% of the change in electric displacement of transition 4-1 occurred between 0.25 and 3.5 seconds, and can be attributed to the cooling from sample temperature $T_{hot}$=101° C. to $T_{cold}$=90° C. The cycle of FIG. 16B at 1 Hz showed a similar response to the reduction in compressive stress during transition 4-1 as the electric displacement increased from 0 to 6 $\mu C/cm^2$ in the first 0.25 seconds. However, in this case, the large cycle frequency did not allow the sample to experience cooling during transition 4-1. Instead, the sample remained at 104° C. for the entire cycle and thus did not experience any change in electric displacement due to a change in temperature. As a result, the generated energy density as well as the overall change in electric displacement between states 4 and 2 for the cycle at 1 Hz were approximately 85% of those at 0.125 Hz. This indicates that the piezoelectric contribution to the new cycle is independent of cycle frequency between 0.125 Hz and 1 Hz.

Figure 17:
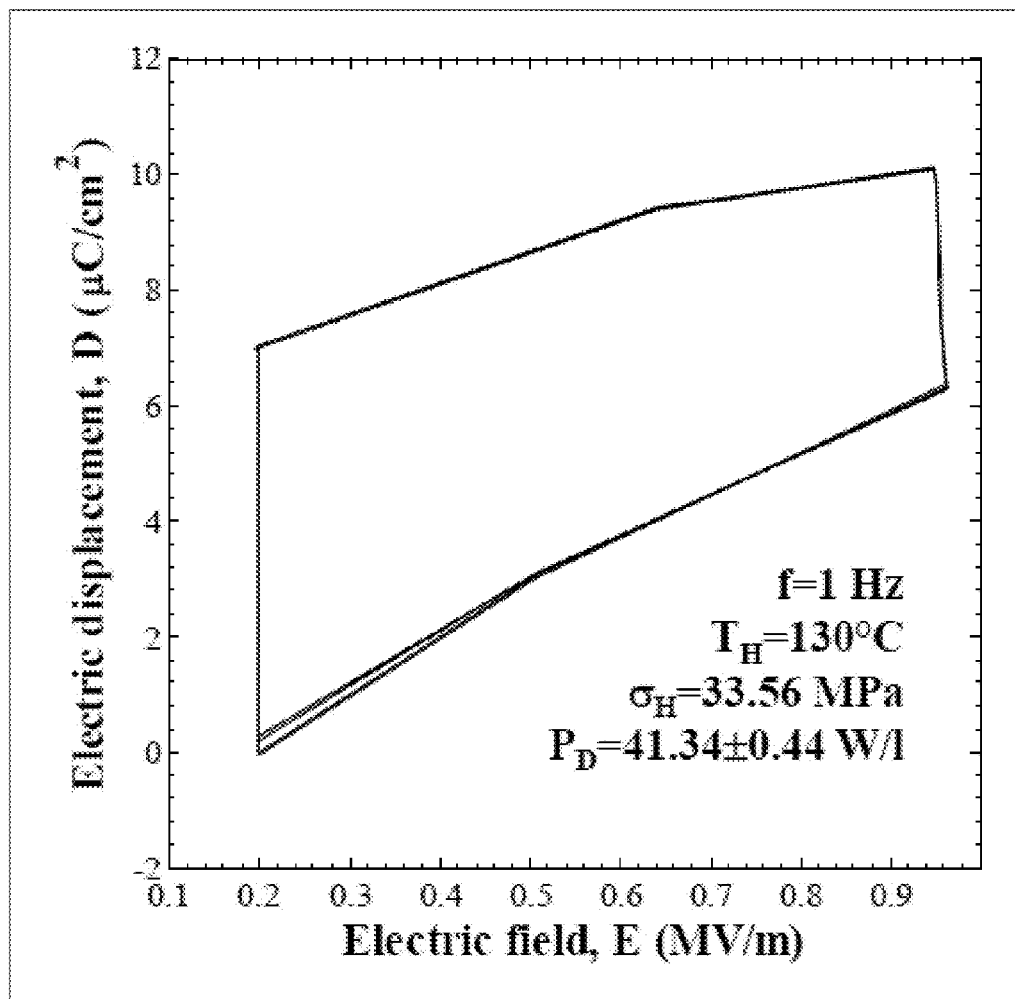
FIG. 17 illustrates electric displacement of a new power cycle as a function of electric field.

FIG. 17 shows five consecutive (superimposed) new cycles performed on PMN-28PT in the D-E diagram corresponding to the maximum generated power density. The thermal source temperatures $T_C$ and $T_H$ were set at 22° C. and 130° C., respectively. The high compressive stress $\sigma_H$ was 33.56 MPa. The low and high electric fields were 0.2 MV/m and 0.95 MV/m, respectively. The cycle frequency was 1 Hz and the resulting sample temperature was $T_{hot} \approx T_{cold}$=85° C., corresponding to the phase boundary between the monoclinic phase and the highly polarized tetragonal phase. The consecutive cycles nearly overlapped, indicating the cycle was repeatable, resulting in power density of 41.3±0.4 W/L.

Table 1 summarizes the operating conditions, energy inputs Qin and Win, generated energy density ND, and the material efficiency η obtained experimentally for various conditions of the new thermomechanical cycle performed on PMN-28PT. Table 1 also provides conditions corresponding to the maximum material efficiency of the Olsen cycle.

TABLE 1

| Cycle type | f (Hz) | $E_H$ (MV/m) | $T_H$ (° C.) | $T_{hot}$ (° C.) | $T_{cold}$ (° C.) | $\sigma_H$ (MPa) | $W_{in}$ (kJ/m³) | $Q_{in}$ (kJ/m³) | $N_D$ (kJ/m³) | η (%) |
|---|---|---|---|---|---|---|---|---|---|---|
| Olsen | 0.021 | 0.75 | — | 170 | 90 | 0 | 0 | 540 | 86 | 15.9 |
| TM | 0.025 | 0.75 | 157 | 108.5 | 51.9 | 18.81 | 30 | 1202 | 24 | 2.0 |
| TM | 0.025 | 0.75 | 107 | 73.9 | 40.2 | 18.81 | 30 | 292 | 15 | 4.7 |
| TM | 0.125 | 0.75 | 160 | 103.1 | 90.4 | 25.13 | 41 | 301 | 32 | 9.4 |
| TM | 0.125 | 0.75 | 130 | 85.1 | 74.4 | 25.13 | 41 | 469 | 31 | 6.1 |
| TM | 0.5 | 0.75 | 160 | 100.9 | 99.9 | 25.13 | 41 | 21 | 27 | 43.5 |
| TM | 0.5 | 0.75 | 130 | 83.2 | 82.2 | 25.13 | 41 | 62 | 26 | 25.2 |
| TM | 1 | 0.75 | 160 | 104.4 | 104.3 | 25.13 | 41 | 2 | 26 | 60.5 |
| TM | 1 | 0.75 | 130 | 85.4 | 85.3 | 25.13 | 41 | 9 | 25 | 50.0 |
| TM | 1 | 0.95 | 130 | 85.4 | 85.3 | 33.56 | 55 | 9 | 41 | 64.1 |

For the entries of Table 1, the material efficiency of the thermomechanical power cycle and of the Olsen cycle was estimated using equation (3). The thermal energy Qin was estimated according to equation (4) using the measured density and specific heat $c_p$ presented in FIG. 9. The mechanical energy input $W_m$ was computed from equation (5) using the area enclosed by the stress-strain curves at 85° C. measured at 0.2 MV/m and 0.95 MV/m for [001] PMN-28PT single crystals. When the new cycle was performed at low frequency, the large heat input resulted in small efficiencies. These results illustrate the importance of operating under small temperature swings and heat input to improve the cycle efficiency.

Moreover, for a given temperature swing, the efficiency was highly dependent on the operating temperatures. For example, the two cycles performed at 0.5 Hz in Table 1 both had similar energy density $N_D$, the same $W_{in}$, and a temperature swing $T_{hot}-T_{cold}=1°$ C., but their efficiencies differed by nearly a factor of two. This difference can be attributed to the operating temperatures. One cycle was performed between 82.3° C. and 83.2° C. where $c_p(T)$ exhibited a phase transition peak and a large thermal hysteresis (FIG. 9) while the other was performed between 99.9° C. and 100.9° C., where no phase transition occurred. This emphasizes the importance of choosing the operating temperatures such that the heat input is minimized and the energy density is maximized in order to maximize the material efficiency η. This can be achieved by operating under adiabatic conditions at a bias temperature near the Curie temperature. In fact, the maximum power density cycle performed at 1 Hz (FIG. 9) achieved an efficiency larger than 64%. In this case, the heat input was $Q_{in}=9$ kJ/m3 and the mechanical work performed was $W_{in}=55$ kJ/m3. Although the sample underwent small temperature fluctuations $T_{hot} \approx T_{cold} \approx 0.1°$ C. during the cycle, the corresponding thermal energy input $Q_{in}$ was comparable to the mechanical energy $W_{in}$.

At low frequencies, it is important to choose $T_{cold}$ such that heating and applying compressive stress have a similar effect on the electric displacement. The two cycles performed at 0.125 Hz in Table 1 illustrate this fact. The cycle performed between 90.4° C. and 103.1° C. had a material efficiency of 9.4%. In this case, the material was in the highly polarized tetragonal phase at $T_{cold}=90.4°$ C. and $E_H=0.75$ MV/m. Then, both heating and the addition of compressive stress during transition 2-3 decreased the electric displacement of the material. On the other hand, for the cycle performed between 74.4° C. and 85.1° C., the sample was near the phase boundary between monoclinic $M_C$ and tetragonal at $T_{cold}=74.4°$ C. and $E_H=0.75$ MV/m. During transition 2-3, the electric displacement decreased with applied compressive stress and increased with heating. In this case, the material efficiency was 6.1%. Both of these cycles yielded a similar energy density; however one consumed an additional 168 kJ/m³ of thermal energy per cycle.

The efficiency reported corresponds to the material's ability to convert thermomechanical energy into electricity. The efficiency of a device implementing the new thermomechanical cycle on PMN-28PT is expected to be significantly lower. In addition, $W_{in}$ was estimated based on properties of PMN-28PT measured at 85° C. In practice, the mechanical work was performed at two different temperatures and the stress-strain behavior may have deviated from that at 85° C. Moreover, $Q_{in}$ was estimated based on the specific heat $c_p(T)$ measured under zero mechanical stress. In practice, the heat input occurred under large uniaxial compressive stress known to affect the phase transition temperatures and the corresponding peaks in $c_p(T)$.

Experimental Results: Thermal Bias Mechanical Energy Harvesting Cycle

Figure 18A:
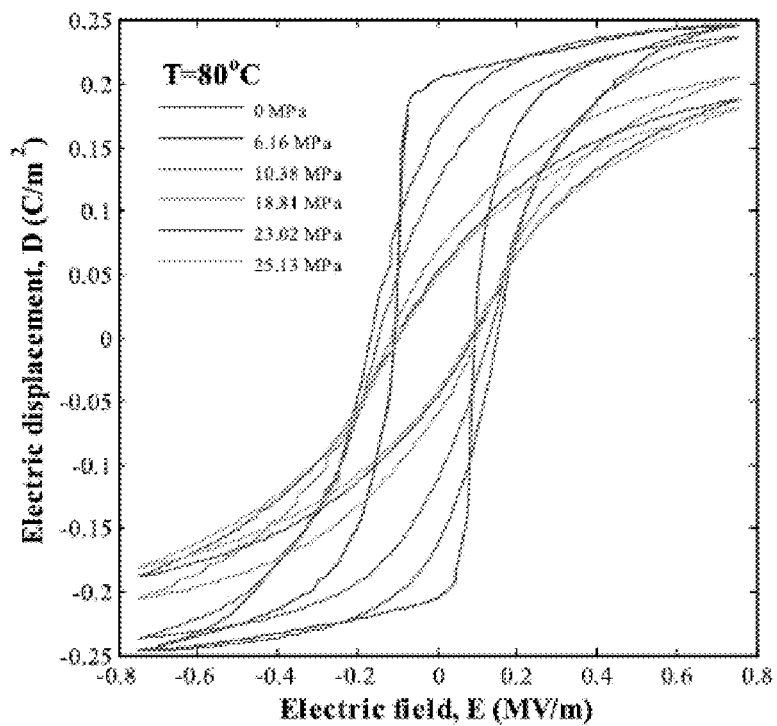
FIGS. 18A-B illustrate electric displacement of a new power cycle as a function of electric field and varying stress.
Figure 18B:
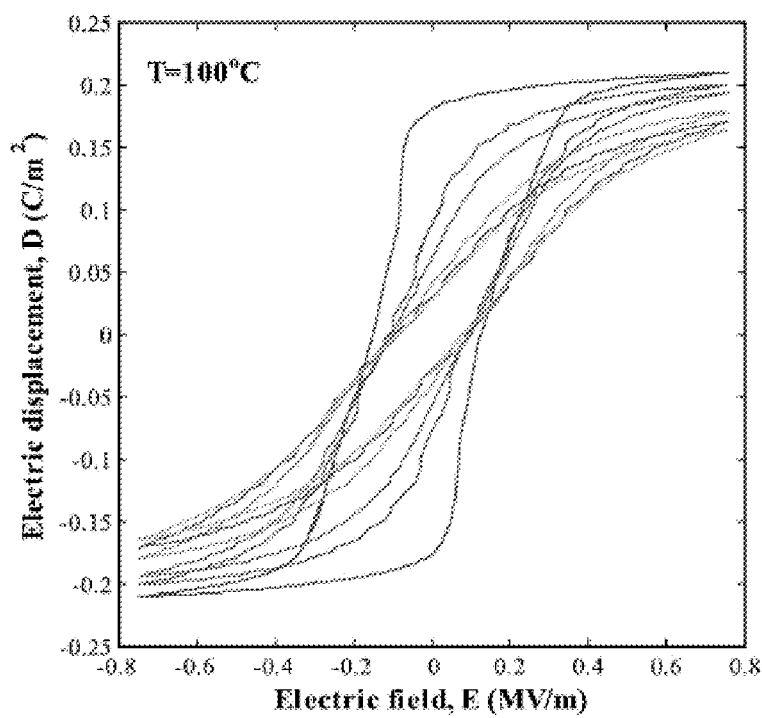

FIGS. 18A-B plot isothermal bipolar D-E loops measured at 0.1 Hz on [001] PMN-28PT samples for bias temperature $T_b$ of 80° C. (FIG. 18A) and 100° C. (FIG. 18B) under mechanical loading ranging between 0 and 25.13 MPa. The D-E loops were closed, and consecutive D-E loops overlapped for temperature and compressive stress considered. This indicates that leakage current through the sample was negligibly small. As seen from FIGS. 18A-B, the D-E loops gradually became slimmer with increasing compressive stress. This behavior is indicative of continuous polarization rotation.

Figure 19A:
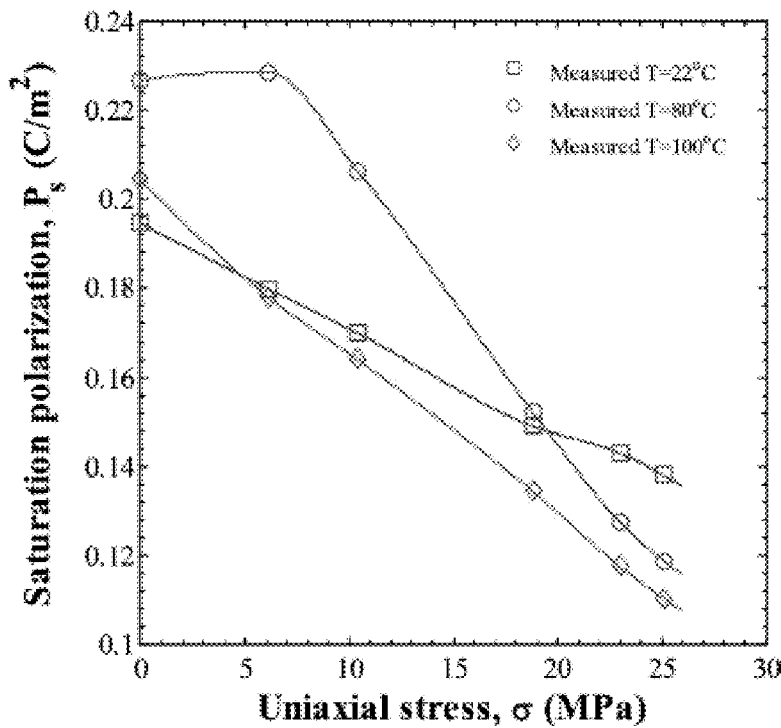
FIG. 19A illustrates saturation polarization.
Figure 19B:
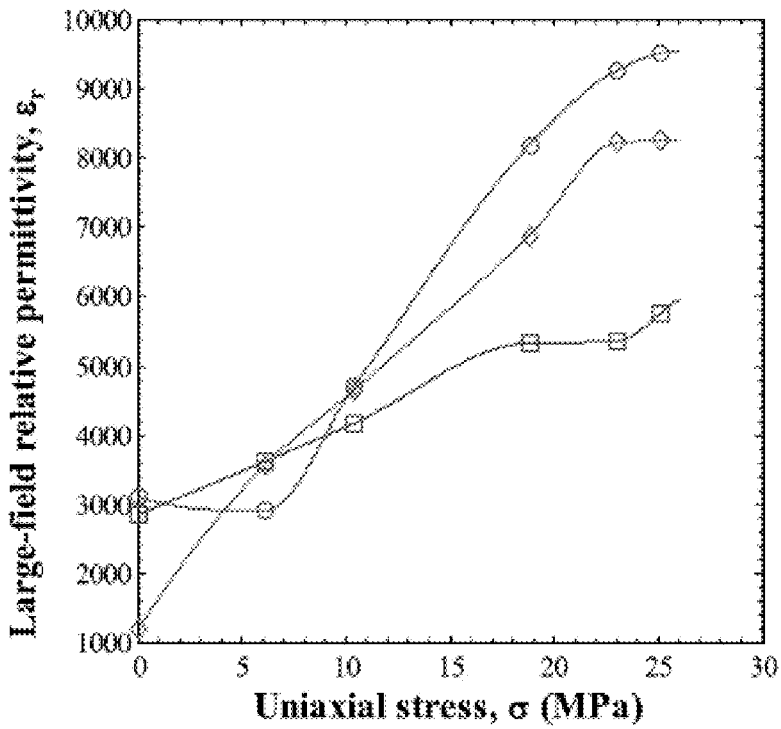
FIG. 19B illustrates large-field relative permeability.

FIG. 19A shows the saturation polarization $P_s(T,\sigma)$ and FIG. 19B shows the large-field dielectric constant $\varepsilon_r(T,\sigma)$ retrieved from the isothermal bipolar D-E loops for temperatures 22° C., 80° C., and 100° C. and compressive stress between 0 and 25.13 MPa. Each data point represents the average over three D-E loops. The error bars have been omitted because they fell within the data markers. In addition, FIGS. 19A-B shows the piecewise cubic hermite interpolating polynomial fit of the properties for each temperature considered. FIG. 19A indicates that the saturation polarization $P_s$ decreased nearly linearly with increasing stress at 22° C. and 100° C. This behavior is also characteristic of continuous polarization rotation corresponding to continuous phase transitions. On the other hand, at 80° C., the saturation polarization was nearly constant below 6.16 MPa and decreased linearly with compressive stress beyond. This can be attributed to phase transition from tetragonal to monoclinic at 80° C. and compressive stress between 6.16 and 10.38 MPa. Indeed, at 80° C., [001] PMN-28PT assumes the tetragonal phase under zero stress and electric field above 0.4 MV/m. In addition, [001] PMN-32PT was reported to assume the monoclinic phase at 80° C. under stress above 10 MPa and electric field below 1 MV/m. As stress increased from 0 to 25 MPa, the largest change in saturation polarization occurred at 80° C., while the smallest change occurred at 22° C. FIG. 19B indicates that the large-field relative permittivity increased with increasing compressive stress for all temperatures considered. This behavior is consistent with bipolar D-E loops reported for [001] PMN-30PT and [001] PMN-32PT at room temperature for compressive stress up to 30 MPa.

Figure 20:
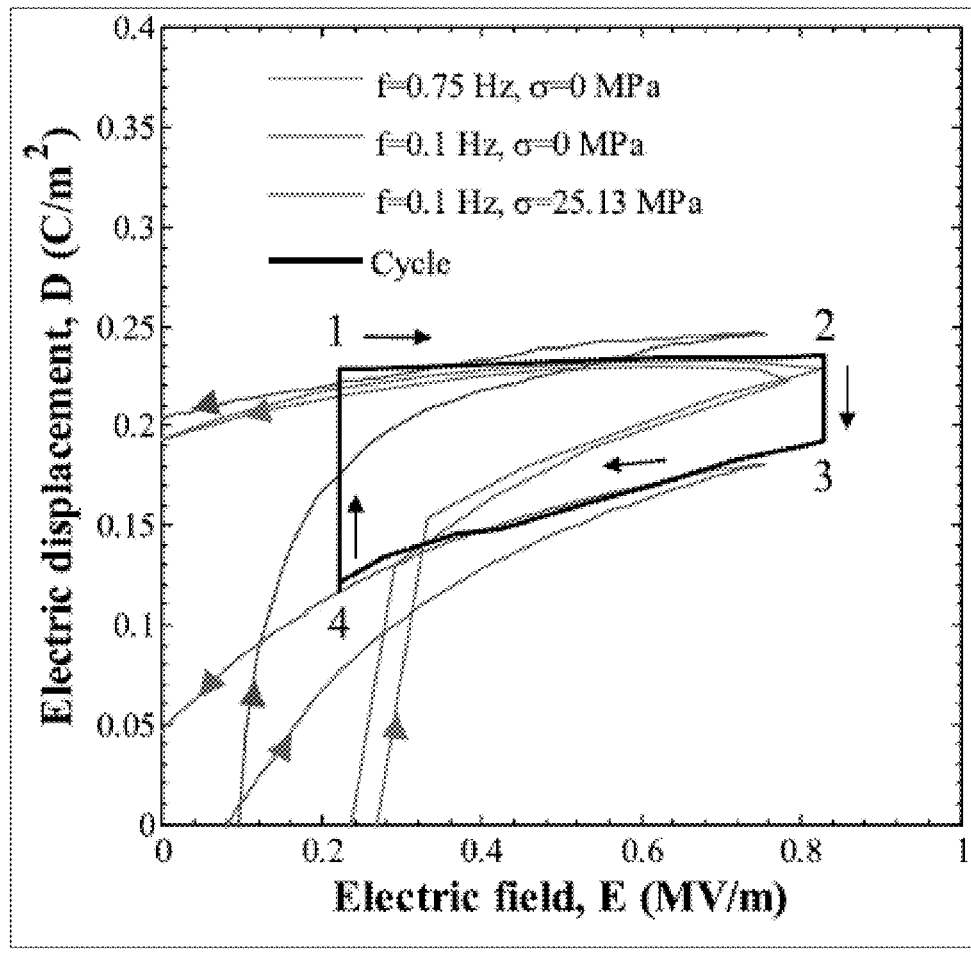
FIG. 20 illustrates electric displacement of a new power cycle as a function of electric field.

FIG. 20 depicts, in the D-E diagram, the new thermal bias cycle performed at 1 Hz at bias temperature $T_b=80°$ C. The electric field was cycled between $E_L=0.2$ MV/m and $E_H=0.8$ MV/m. A compressive stress of $\sigma_H=25.13$ MPa was applied during transitions 2-3 and 3-4. The cycle traveled in the clockwise direction and therefore produced electrical energy. FIG. 20 also shows the isothermal bipolar D-E loops measured at 80° C. at 0.1 Hz under zero stress and $\sigma_H=25.13$ MPa as well as at 0.75 Hz under zero stress. Note that the rate of electric field change dE/dt for the D-E loops at 0.1 Hz and 0.75 Hz was 0.3 MV/m/s and 2.4 MV/m/s, respectively. Transitions 1-2 and 3-4 of the cycle performed at 1 Hz corresponded to a time rate of change in electric field of 2.4 MV/m/s. However, FIG. 20 indicates that at the frequencies considered, the D-E loops were independent of dE/dt. The thermal bias cycle shown was vertically translated to match the electric displacement of the D-E loop for $T_b$ and $\sigma_H=25.13$ MPa. The cycle closely followed the bipolar D-E loops corresponding to the conditions of the cycle. Thus, using the properties $P_s(T,\sigma)$ and $\varepsilon_r(T,\sigma)$ previously retrieved from the bipolar D-E loops at 0.1 Hz, it was possible to predict the power density based on equation (6).

Given the phase diagram of PMN-28PT at a frequency of 10 Hz, at bias temperature of 80° C., PMN-28PT is estimated to have been in the tetragonal (T) phase at both state 1 and 2 of the cycle. This is supported by the fact that (i) the coercive electric field in the D-E loops at low frequency of 0.1 Hz was around 0.1 MV/m and (ii) the change in electric displacement between these states was small as illustrated in FIG. 20. Additionally, the application of compressive stress during the transition 2-3 may have caused the sample to undergo a phase transition into the monoclinic $M_A$ phase, as suggested by the T-$M_A$ phase transition occurring in [001] PMN-32PT at 0.8 MV/m and 80° C. under σ=13 MPa. Furthermore, the decrease in electric field during the transition 3-4 caused another phase transition into the depolarized orthorhombic O phase. This was suggested by the $M_A$-O phase transition in [001] PMN-32PT occurring at 0.2 MV/m and 80° C. under σ=20 MPa. Finally, during the transition 4-1, when stress was removed at constant electric field 0.2 MV/m, the sample transitioned back to the tetragonal phase. Thus, during the cycle at 80° C., the sample successfully alternated between a depolarized state and a highly polarized state corresponding to a large change in electric displacement and a large energy density.

Figure 21:
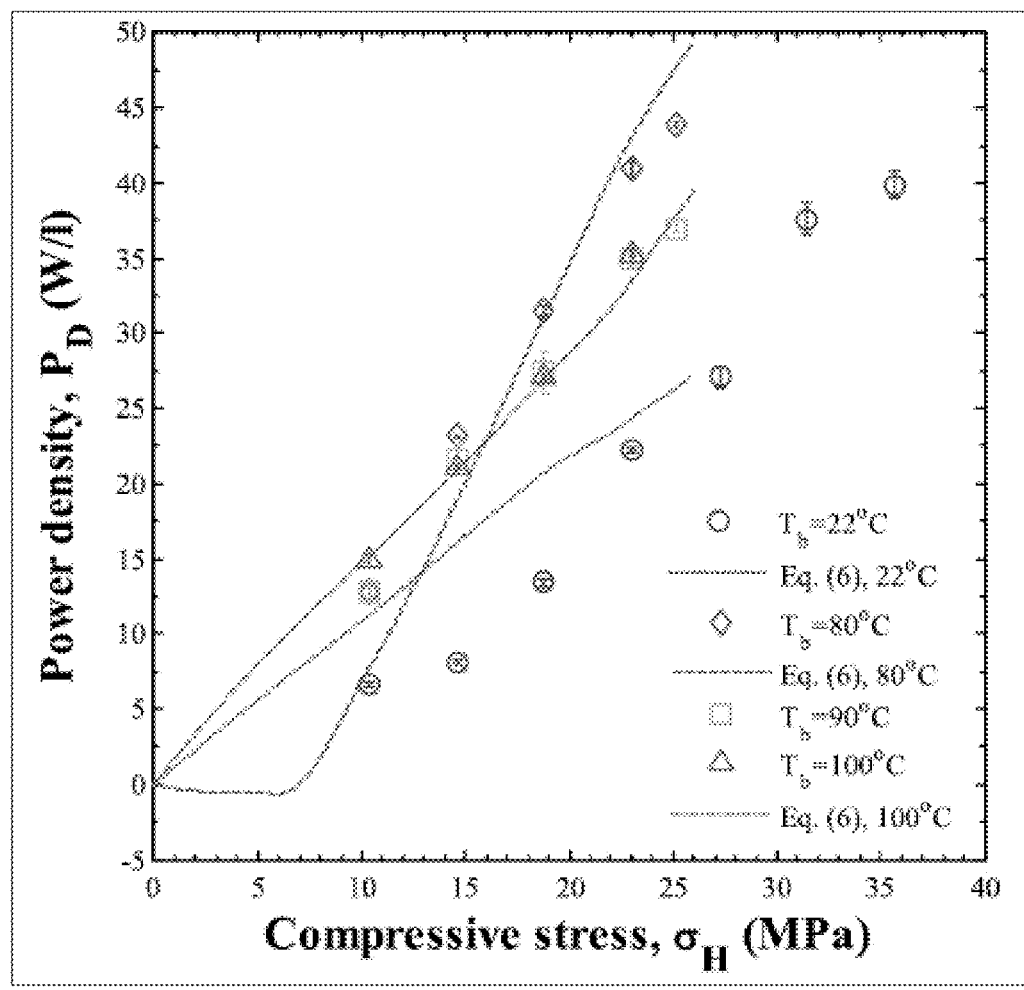
FIG. 21 illustrates power density of a new power cycle as a function of stress.

FIG. 21 shows the power density generated by the new thermal bias cycle as a function of applied compressive stress $\sigma_H$ for bias temperature $T_b$ ranging between 22° C. and 100° C. Here, the frequency was fixed at 1 Hz while the electric field was cycled between 0.2 MV/m and 0.8 MV/m. Each data point represents an average of five cycles and the error bars correspond to one standard deviation or 63% confidence interval. FIG. 21 indicates that the power density increased nearly linearly with increasing $\sigma_H$ for any given bias temperature $T_b$. For $T_b$ above 80° C., the power density decreased and was nearly identical for 90° C. and 100° C. In fact, the largest power density of 44 W/L was achieved for bias temperature of 80° C. with a compressive stress of 25.13 MPa. This optimum performance can be explained by the tetragonal to monoclinic to orthorhombic phase transition sequence previously discussed. On the other hand, for bias temperatures of 90° C. and 100° C., the material remained in the highly polarized tetragonal phase away from any phase boundaries for all electric fields considered under zero stress. At these temperatures, the application of large compressive stress during the transition 2-3 also caused a phase transition into the monoclinic phase. However, the decrease in electric field during the transition 3-4 did not lead to a phase transition into the orthorhombic phase. This interpretation is supported by extrapolation of the [001] PMN-32PT phase diagram to PMN-28PT at 90° C. and 100° C. This resulted in nearly identical power density generated versus compressive stress at these temperatures.

For cycles performed at 22° C., the material transitioned from the rhombohedral to the monoclinic phase during the transition 1-2, as suggested by the PMN-28PT phase diagram at zero stress. For large compressive stress $\sigma_H$ the sample transitioned into the orthorhombic phase during the transition 3-4, as suggested by the PMN-32PT phase diagram. Overall, the power density with $T_b$=22° C. was limited by the fact that the sample never reached the highly polarized tetragonal phase. These results indicate that to maximize power generation of PMN-28PT, the new cycle should be performed at temperatures where the tetragonal phase is present. In addition, the compressive stress $\sigma_H$ should be large enough to induce the orthorhombic phase at the temperature and electric field corresponding to state 2 of the cycle.

Figure 22:
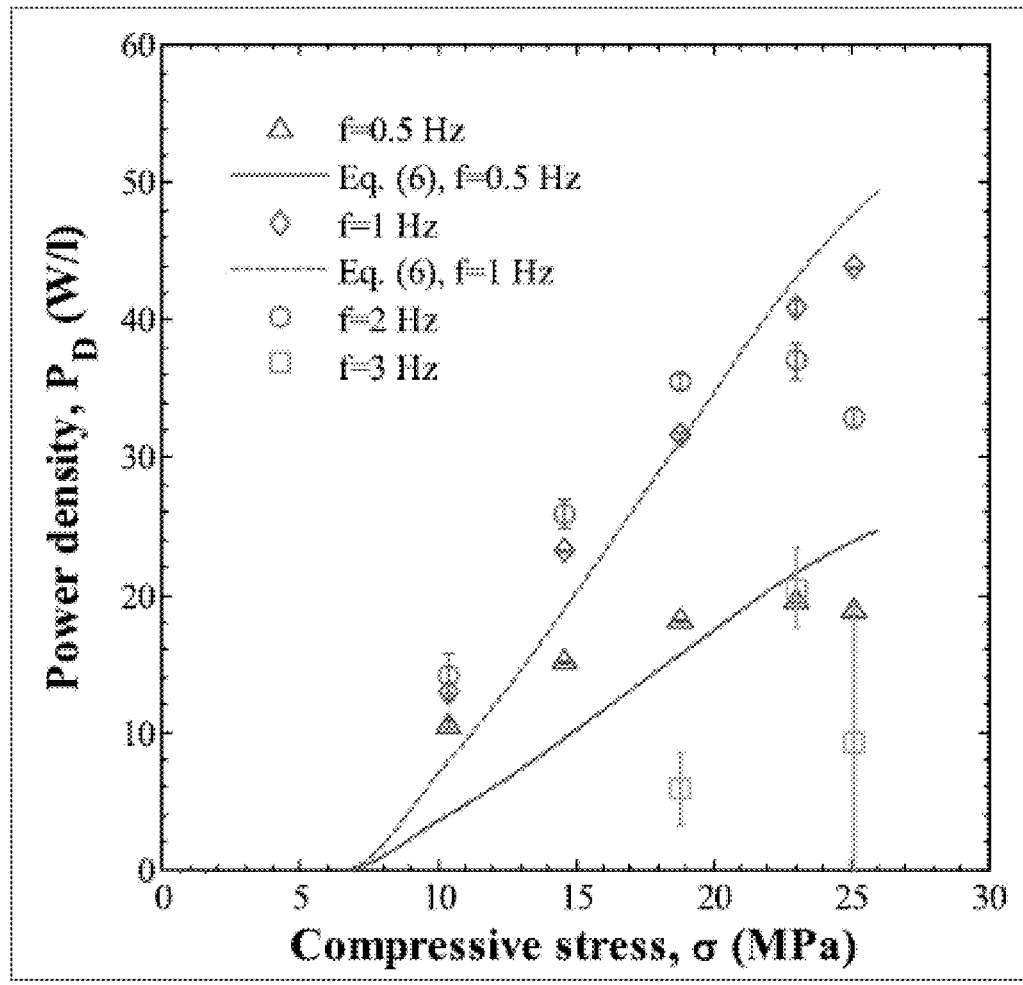
FIG. 22 illustrates power density of a new power cycle as a function of stress.

FIG. 22 shows the power density generated by the new thermal bias cycle as a function of compressive stress $\sigma_H$ for frequency of 0.5 Hz, 1 Hz, 2 Hz, and 3 Hz. The low and high electric fields $E_L$ and $E_H$ were set at 0.2 MV/m and 0.8 MV/m, and the bias temperature $T_b$ was 80° C. Each data point represents an average over five cycles and the error bars correspond to one standard deviation or 63% confidence interval. It is evident that the power density increased with increasing compressive stress for frequency below 1 Hz. However, at higher frequency, the power density reached a maximum at compressive stress of 23.02 MPa and decreased beyond. This can be attributed to the fact that, at high cycle frequency, the electric displacement did not reach its equilibrium value during the transitions 2-3 and 4-1. Furthermore, the large error bars for frequency of 3 Hz were due to inconsistent changes in electric displacement from one cycle to the next. FIG. 22 establishes that a cycle frequency of 1 Hz yields the largest power density for large compressive stress at 80° C.

Figure 23A:
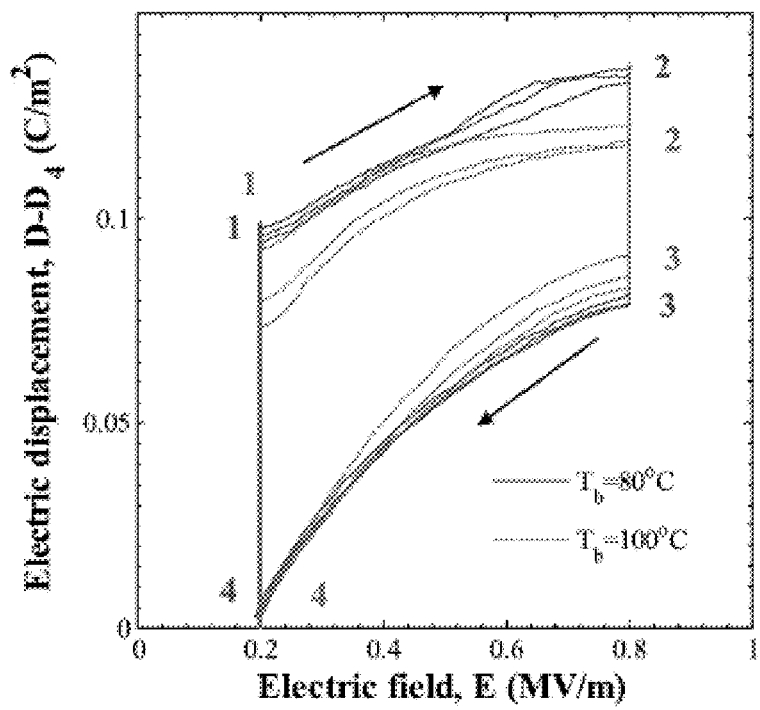
FIG. 23A illustrates electric displacement versus electric field.
Figure 23B:
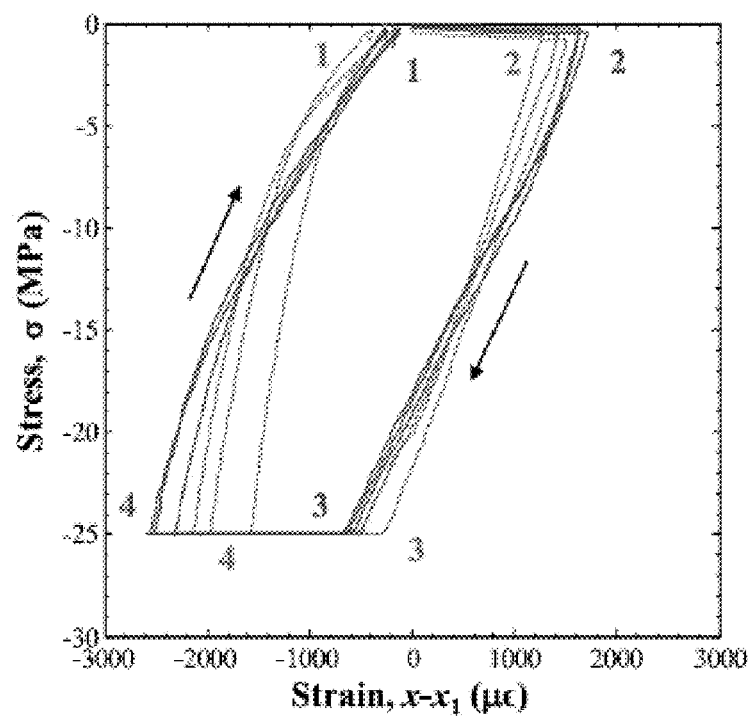
FIG. 23B illustrates stress versus strain.

FIG. 23A presents the relative electric displacement D-$D_4$ as a function of electric field E experimentally measured during the new thermal bias cycle performed at $T_b$=80° C. and $T_b$=100° C. at low frequency f≈0.004 Hz with $E_L$=0.2 MV/m, $E_H$=0.8 MV/m, and $\sigma_H$=25 MPa. FIG. 23B shows the corresponding experimentally measured stress a versus relative strain x-$x_1$. The energy density $N_D$ was measured as 39.7±1.0 J/L/cycle and 31.2±1.0 J/L/cycle and the mechanical work $W_{in}$ was 53.1±1.3 J/L/cycle and 47.7±3.1 J/L/cycle for cycles performed at 80 and 100° C., respectively. The corresponding material efficiency η, given by equation (2), was equal to 74.6%±0.1% and 65.3%±3.3%, respectively. Note that the heat input $Q_{in}$ was taken as zero, due to the bias temperature kept constant during the cycle. These large efficiencies demonstrate that the material undergoing the new cycle was efficient at converting mechanical energy into electrical energy. The largest energy density, power density, and material efficiency were achieved at 80° C., due to the tetragonal-monoclinic-orthorhombic phase transition sequence resulting in large changes in electric displacement, as previously discussed. In addition, less mechanical energy was required to cause these phase transitions at 80° C. than at 90° C. or 100° C. At 100° C., the PMN-28PT sample had not transitioned to the orthorhombic phase for the stresses considered. This is illustrated in FIGS. 23A-B by the fact that increasing compressive stress from 0 to 25 MPa during transition 2-3 produced a larger change in (i) strain and (ii) electric displacement at 80° C. than at 100° C.

The maximum material efficiency of 87.3%±5.6% was obtained at low frequency f≈0.004 Hz with $T_b$=85° C., $E_L$=0.2 MV/m, $E_R$=0.95 MV/m, and $\sigma_H$=34 MPa. Under these conditions, $N_D$=47.8±1.4 J/L/cycle and $W_{in}$=32 54.9±1.9 J/L/cycle. These operating conditions were the same as those that yielded the maximum material efficiency of 64.1% for the new thermomechanical cycle. Thus, the new thermal bias cycle achieved larger material efficiency by replacing the thermal cycling in the new thermomechanical cycle with a temperature bias.

Experimental Results: Thermal Bias Mechanical Energy Harvesting Cycle Compared to Model FIG. 21 compares experimental data and model predictions obtained from equation (6) for the power density $P_D$ at bias temperatures $T_b$ of 22° C., 80° C., and 100° C. Predictions were based on the dielectric properties previously estimated from isothermal bipolar D-E loops measured at these temperatures. Analysis of the electric displacement variations $D(t)-D_4$ versus time $t$ with $T_b=80°$ C. for cycle frequency ranging from 0.5 Hz to 2 Hz confirmed that the properties extracted from the D-E loops at 0.1 Hz can be used in the model given by equation (6). FIG. 21 indicates that the model predictions agreed well with experimental data. In fact, the average relative error between experimental data and model predictions was 47.6%, 13.9%, and 2.4% for $T_b$ equal to 22° C., 80° C., and 100° C., respectively. The largest error for $T_b=22°$ C. corresponded to small values of $\sigma_H$.

FIG. 22 shows the model predictions of the power density at $T_b=80°$ C. for frequency of 0.5 Hz and 1 Hz. Here also, the model yields reasonable predictions. In fact, the average relative error between experimental data and model predictions at 0.5 Hz and 1 Hz was 29.1% and 13.9%, respectively. Note that the model did not yield accurate predictions for frequencies larger than 1 Hz because the cycle did not follow the path of the D-E loops at 0.1 Hz. In other words, D did not reach its equilibrium value during the transitions 2-3 and 4-1 as previously discussed. Overall, these results validate the model for $P_D$ given by equation (6). Thus, the model can be used to predict energy and power densities from the material dielectric properties.

Thus has been described a novel thermomechanical cycle, with variation of a new thermal bias cycle. Also described was experimental implementation and experimental results of the new cycles performed on [001]-poled PMN-28PT single crystals. Each cycle includes four states, and four transitions between the states. In the new thermomechanical cycle, the transitions relate to applied electric field, stress, and temperature. In the new thermal bias cycle, the transitions relate to applied electric field and stress.

For the new thermomechanical cycle on ferroelectric [001]-poled PMN-28PT single crystals, maximum energy and power densities of 41 J/L/cycle and 41 W/L were achieved with cycles performed at 1 Hz with thermal source temperatures of 22° C. and 130° C. and electric field cycled between 0.2 MV/m and 0.95 MV/m under compressive stress 33.56 MPa. These conditions also yielded the maximum material efficiency of converting thermomechanical energy into electric energy of 64.1%. The energy density of the new thermomechanical cycle was found to be nearly independent of cycle frequency, while the power density and efficiency increased with increasing cycle frequency. Both the energy and power densities increased with increasing compressive stress. The new thermomechanical cycle was able to convert thermal and mechanical energies into electrical energy at all temperatures considered. The new thermomechanical cycle was also capable of maintaining constant power output for changing hot source temperature by adjusting the applied stress.

For the new thermal bias cycle, maximum energy and power densities of 44 J/L/cycle and 44 W/L were achieved at 1 Hz for bias temperature $T_b$ of 80° C. and electric field cycled between 0.2 MV/m and 0.8 MV/m with compressive stress $\sigma_H$=25.13 MPa on ferroelectric [001]-poled PMN-28PT single crystals. In addition, the power density increased with increasing compressive stress for cycle frequency less than or equal to 1 Hz. For higher cycle frequency, the power density reached a maximum for compressive stress equal to $\sigma_H$=23.03 MPa. The maximum power density of the new cycle was obtained for temperature bias of 80° C., due to tetragonal to monoclinic to orthorhombic phase transition sequence during the cycle resulting in large changes in electric displacement. The material efficiency of the thermal bias version of the new power cycle exceeded that of the thermomechanical variation of the new power cycle. The energy and power densities generated by the thermal bias version of the new power cycle were orders of magnitude larger than alternative mechanical energy conversion methods. A physics-based model predicting the power density was derived and validated against experimental data. It can be used to predict the energy and power densities for any material based on their dielectric properties and the operating electric fields, temperature, and frequency.

The new thermomechanical cycle and variant thermal bias cycle may be used in many applications to convert mechanical and/or thermal energy into electrical energy. By way of example, waste heat and/or mechanical energy in a vehicle may be converted to electrical energy, and the electrical energy fed back into a battery. Alternatively or additionally in this example, vehicle acceleration may be used to provide energy for application of stress to the piezoelectric component. Many other opportunities for using the new power cycles described in this disclosure will be apparent.

As used herein, the terms "substantially" and "about" are used to describe and account for small variations. When used in conjunction with an event or circumstance, the terms can refer to instances in which the event or circumstance occurs precisely as well as instances in which the event or circumstance occurs to a close approximation. For example, the terms can refer to less than or equal to ±10%, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

While the disclosure has been described with reference to the specific embodiments thereof, it should be understood by those skilled in the art that various changes may be made and equivalents may be substituted without departing from the true spirit and scope of the disclosure as defined by the appended claims. In addition, many modifications may be made to adapt a particular situation, material, composition of matter, method, operation or operations, to the objective, spirit and scope of the disclosure. All such modifications are intended to be within the scope of the claims appended hereto. In particular, while certain methods may have been described with reference to particular operations performed in a particular order, it will be understood that these operations may be combined, sub-divided, or re-ordered to form an equivalent method without departing from the teachings of the disclosure. Accordingly, unless specifically indicated herein, the order and grouping of the operations is not a limitation of the disclosure.

What is claimed is:

1. A method for generating electrical energy, comprising:
   (a) increasing an electric field applied to a piezoelectric component from $E_L$ to $E_H$, maintaining a temperature of the piezoelectric component at $T_C$, and maintaining a mechanical stress applied to the piezoelectric component at $\sigma_L$;
   (b) increasing the mechanical stress applied to the piezoelectric component from $\sigma_L$ to $\sigma_H$, increasing the temperature of the piezoelectric component from $T_C$ to $T_H$, and maintaining the electric field applied to the piezoelectric component at $E_H$;
   (c) decreasing the electric field applied to the piezoelectric component from $E_H$ to $E_L$, maintaining the temperature of the piezoelectric component at $T_H$, and maintaining the mechanical stress applied to the piezoelectric component at $\sigma_H$;
   (d) decreasing the mechanical stress applied to the piezoelectric component from $\sigma_H$ to $\sigma_L$, decreasing the temperature of the piezoelectric component from $T_H$ to $T_C$, and maintaining the electric field applied to the piezoelectric component at $E_L$; and repeatedly cycling through operations (a)-(d).

2. The method of claim 1, wherein the temperatures $T_C$ and $T_H$ of the piezoelectric component are controlled by a hot thermal source and a cold thermal source, and the mechanical stress is applied by a stress source.

3. The method of claim 2, wherein an electrical energy is converted from one or both of a thermal energy from the hot thermal source and the cold thermal source and a mechanical energy from the stress source when the operations (a)-(d) are repeatedly cycled.

4. The method of claim 1, wherein an electrical current is generated from the piezoelectric component when the operations (a)-(d) are repeatedly cycled.

5. The method of claim 1, wherein an electrical current is generated from the piezoelectric component by a change of surface charge of the piezoelectric component being repeatedly cycled through the operations (a)-(d).

6. The method of claim 1, wherein $T_C$ is a selected bias temperature at which applying stress to the piezoelectric component causes at least one solid state phase transformation in a material of the piezoelectric component.

7. The method of claim 6, wherein the bias temperature is further selected as a temperature at which a transition of the mechanical stress from $\sigma_L$ to $\sigma_H$ causes the at least one solid state phase transformation to be a phase transformation with an optimized polarization change.

8. The method of claim 1, wherein the piezoelectric component includes a pyroelectric material.

9. The method of claim 8, wherein the pyroelectric material is a PbMg⅓Nb⅔O3-xPbTiO3 (PMN-xPT) crystal.

10. The method of claim 1, wherein the piezoelectric component includes one of, or a composite of, a biological, a ceramic, a crystal, and a polymeric pyroelectric material.

11. The method of claim 1, wherein the operations (a)-(d) are repeatedly cycled at a frequency equal to or greater than 0.1 Hz, equal to or greater than 1 Hz, or equal to or greater than 10 Hz.

12. The method of claim 1, wherein the electrical field is applied along a poling direction of the piezoelectric component.

13. The method of claim 1, wherein the mechanical stress of $\sigma_H$ is a compressive stress applied along a poling direction of the piezoelectric component.

14. The method of claim 1, wherein the electrical field is applied along a first direction normal to a second direction along which the mechanical stress of $\sigma_H$ is applied.

15. The method of claim 1, wherein an angle between a first direction along which the electrical field is applied and a second direction along which the mechanical stress of $\sigma_H$ is applied is less than ninety degrees.

16. The method of claim 1, wherein a first direction along which the electrical field is applied is different from a second direction along which the mechanical stress of $\sigma_H$ is applied.

17. The method of claim 1, wherein the electric field of $E_H$ and the mechanical stress of $\sigma_H$ are determined to keep the temperature of the piezoelectric component below the Curie temperature $T_{Curie}$.

18. The method of claim 1, wherein the electric field of $E_H$ and the mechanical stress of $\sigma_H$ are determined to adapt to a type of energy received, where the type of energy received is one or both of thermal energy and mechanical energy.

19. The method of claim 1, wherein the operations (a) and (c) are isothermal transitions.

20. The method of claim 1, wherein $\sigma_L$ is less than $\sigma_H$.

21. The method of claim 1, wherein $\sigma_L$ equals zero and $\sigma_H$ is greater than zero.

22. A method for generating electrical energy, comprising:
(a) increasing an electric field applied to a piezoelectric component from $E_L$ to $E_H$, and maintaining a mechanical stress applied to the piezoelectric component at $\sigma_L$;
(b) increasing the mechanical stress applied to the piezoelectric component from $\sigma_L$ to $\sigma_H$, and maintaining the electric field applied to the piezoelectric component at $E_H$;
(c) decreasing the electric field applied to the piezoelectric component from $E_H$ to $E_L$, and maintaining the mechanical stress applied to the piezoelectric component at $\sigma_H$;
(d) decreasing the mechanical stress applied to the piezoelectric component from $\sigma_H$ to $\sigma_L$, and maintaining the electric field applied to the piezoelectric component at $E_L$; and
repeatedly cycling through operations (a)-(d).

23. The method of claim 22, wherein the operations (a)-(d) form an isothermal cycle and a temperature of the piezoelectric component is maintained at a bias temperature $T_b$ throughout the operations (a)-(d).

24. The method of claim 22, wherein the electrical field and the mechanical stress are applied to a poling direction of the piezoelectric component.

25. The method of claim 22, wherein an electrical current is generated from the piezoelectric component by a change of surface charge of the piezoelectric component that is repeatedly cycled through the operations (a)-(d).

26. The method of claim 22, wherein $\sigma_L$ equals zero and $\sigma_H$ is greater than zero.

27. The method of claim 22, wherein the mechanical stress of $\sigma_H$ is a compressive stress applied along a poling direction of the piezoelectric component.

* * * * *